United States Patent
Jeong et al.

(10) Patent No.: US 12,245,456 B2
(45) Date of Patent: Mar. 4, 2025

(54) DISPLAY DEVICE

(71) Applicant: Samsung Display Co., LTD., Yongin-si (KR)

(72) Inventors: Seong Jin Jeong, Hwaseong-si (KR); Jin Sook Bang, Hwaseong-si (KR); Sang Hoon Yim, Suwon-si (KR); Eun Jeong Hong, Yongin-si (KR); Kwan Hee Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 492 days.

(21) Appl. No.: 17/694,847

(22) Filed: Mar. 15, 2022

(65) Prior Publication Data
US 2023/0028269 A1    Jan. 26, 2023

(30) Foreign Application Priority Data
Jul. 22, 2021    (KR) .......................... 10-2021-0096366

(51) Int. Cl.
*H10K 50/858* (2023.01)
*H10K 50/84* (2023.01)
*H10K 59/121* (2023.01)
*H10K 59/122* (2023.01)
(Continued)

(52) U.S. Cl.
CPC ........... *H10K 50/858* (2023.02); *H10K 50/84* (2023.02); *H10K 59/121* (2023.02); *H10K 59/122* (2023.02); *H10K 59/124* (2023.02); *H10K 59/353* (2023.02)

(58) Field of Classification Search
CPC .... H10K 50/858; H10K 50/84; H10K 59/121; H10K 59/124; H10K 59/353; H10K 59/122
See application file for complete search history.

(56) References Cited

U.S. PATENT DOCUMENTS

| 10,319,945 B2 * | 6/2019 | Kim ....................... H10K 50/85 |
| 10,388,913 B2 | 8/2019 | Jung et al. |
| 10,459,557 B2 * | 10/2019 | Hong ................... H10K 59/873 |

(Continued)

FOREIGN PATENT DOCUMENTS

| KR | 10-2018-0005323 | 1/2018 |
| KR | 10-2019-0062678 | 6/2019 |
| KR | 10-2020-0089379 | 7/2020 |

*Primary Examiner* — Marlon T Fletcher
*Assistant Examiner* — Da Wei Lee
(74) *Attorney, Agent, or Firm* — KILE PARK REED & HOUTTEMAN PLLC

(57) ABSTRACT

A display device includes a first light emitting element, a second light emitting element, and a third light emitting element that are disposed on a substrate and emitting light of different colors, respectively; a first insulation layer disposed on the first light emitting element, the second light emitting element, and the third light emitting element, and including at least one opening; and a second insulation layer disposed on the first insulation layer, and disposed in the at least one opening, wherein a refractive index of the second insulation layer is higher than a refractive index of the first insulation layer, and the at least one opening overlaps at least one of the first light emitting element, the second light emitting element, and the third light emitting element in a plan view, and does not overlap at least another one in a plan view.

15 Claims, 15 Drawing Sheets

(51) Int. Cl.
  *H10K 59/124* (2023.01)
  *H10K 59/35* (2023.01)

(56) References Cited

U.S. PATENT DOCUMENTS

| | | | |
|---|---|---|---|
| 10,490,603 B2* | 11/2019 | Ma | H10K 59/123 |
| 11,005,076 B2* | 5/2021 | Lee | H10K 59/38 |
| 2018/0138458 A1* | 5/2018 | Tokuda | H10K 50/844 |
| 2018/0301665 A1* | 10/2018 | Sakamoto | H10K 59/12 |
| 2019/0074339 A1* | 3/2019 | Ma | H10K 59/878 |
| 2019/0165061 A1 | 5/2019 | Jung et al. | |
| 2021/0013452 A1 | 1/2021 | Kim et al. | |
| 2021/0175300 A1 | 6/2021 | Kim et al. | |

* cited by examiner

DISPLAY DEVICE

CROSS-REFERENCE TO RELATED APPLICATION

This application claims priority to and the benefit of Korean Patent Application No. 10-2021-0096366 under 35 U.S.C. § 119, filed in the Korean Intellectual Property Office (KIPO) on Jul. 22, 2021, the entire contents of which are incorporated herein by reference.

BACKGROUND

1. Technical Field

The disclosure relates to a display device capable of improving light emission efficiency and display quality.

2. Description of the Related Art

A display device is a device that displays a screen, and includes a liquid crystal display (LCD), an organic light emitting diode (OLED) display, and the like. Such a display device is used in various electronic devices such as a portable phone, a navigation device, a digital camera, an electronic book, a portable game device, or various terminals.

The display device has a multi-layer structure. For example, the display device may have a multi-layer structure in which a light emitting element, a touch sensor, and the like are stacked each other on a substrate. Light generated by the light emitting element passes through multiple layers and is emitted to the outside of the display device, and thus a screen may be displayed. However, some of the light generated by the light emitting element may be reflected and lost by an interface between adjacent layers, and may not be emitted to the outside. Accordingly, front light emitting efficiency of the display device and display quality may be deteriorated.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a display device that can improve light emission efficiency and display quality.

A display device according to an embodiment includes a first light emitting element, a second light emitting element, and a third light emitting element that are disposed on a substrate and emitting light of different colors, respectively; a first insulation layer disposed on the first light emitting element, the second light emitting element, and the third light emitting element, the first insulation layer including at least one opening; and a second insulation layer disposed on the first insulation layer, the second insulation layer being disposed in the at least one opening, wherein a refractive index of the second insulation layer is higher than a refractive index of the first insulation layer, and the at least one opening overlaps at least one of the first light emitting element, the second light emitting element, and the third light emitting element in a plan view, and the at least one opening does not overlap at least another one of the first light emitting element, the second light emitting element, and the third light emitting element in a plan view.

The at least one opening may overlap the first light emitting element and the third light emitting element in a plan view, and may not overlap the second light emitting element in a plan view.

The first insulation layer may cover the entire second light emitting element.

The first light emitting element may emit red light, the second light emitting element may emit green light, and the third light emitting element may emit blue light.

The at least one opening may overlap the first light emitting element in a plan view, and the at least one opening may not overlap the second light emitting element or the third light emitting element in a plan view.

The display device according to the embodiment may further include a first pixel electrode, a second pixel electrode, and a third pixel electrode disposed on the substrate; and a bank layer disposed on the first pixel electrode, the second pixel electrode, and the third pixel electrode, and the bank layer including a plurality of pixel openings overlapping the first pixel electrode, the second pixel electrode, and the third pixel electrode in a plan view, the at least one opening may overlap at least one of the plurality of pixel openings in a plan view, and the at least one opening may not overlap at least another one of the plurality of pixel openings in a plan view.

The display device according to the embodiment may further include a first emission layer disposed on the first pixel electrode; a second emission layer disposed on the second pixel electrode; a third emission layer disposed on the third pixel electrode; and a common electrode disposed on the first emission layer, the second emission layer, the third emission layer, and the bank layer. The at least one opening may overlap at least one of the first emission layer, the second emission layer, and the third emission layer in a plan view, and the at least one opening may not overlap at least another one of the first emission layer, the second emission layer, and the third emission layer in a plan view.

The first pixel electrode, the first emission layer, and the common electrode may form the first light emitting element, the second pixel electrode, the second emission layer, and the common electrode may form the second light emitting element, and the third pixel electrode, the third emission layer, and the common electrode may form the third light emitting element.

The at least one opening may overlap the first pixel electrode and the first emission layer in a plan view and may overlap the third pixel electrode and the third emission layer in a plan view, and the at least one opening may not overlap the second pixel electrode and the second emission layer in a plan view.

The at least one opening may overlap the first pixel electrode and the first emission layer in a plan view, the at least one opening may not overlap the second pixel electrode, the second emission layer in a plan view, and may not overlap the third pixel electrode and the third emission layer in a plan view.

The plurality of pixel openings may be positioned within the at least one opening in a plan view.

A refractive index of the first insulation layer may be in a range of about 1.40 to about 1.59, and a refractive index of the second insulation layer may be in a range of about 1.60 to about 1.80.

A thickness of the first insulation layer may be in a range of about 2.0 μm to about 3.5 μm.

The second insulation layer may be formed of a light-transmitting organic insulating material or a pressure-sensitive adhesive.

The display device according to the embodiment may further include an encapsulation layer disposed on the first light emitting element, the second light emitting element, and the third light emitting element; and a sensing electrode disposed on the encapsulation layer, wherein the first insulation layer may be disposed on the sensing electrode.

A display device according to an embodiment includes a first pixel electrode, a second pixel electrode, and a third pixel electrode that are disposed on a substrate; a bank layer disposed on the first pixel electrode, the second pixel electrode, and the third pixel electrode, the bank layer including a plurality of pixel openings overlapping the first pixel electrode, the second pixel electrode, and the third pixel electrode in a plan view; a first emission layer disposed on the first pixel electrode; a second emission layer disposed on the second pixel electrode; a third emission layer disposed on the third pixel electrode; a common electrode disposed on the first emission layer, the second emission layer, and the third emission layer; an encapsulation layer disposed on the common electrode; a sensing electrode disposed on the encapsulation layer; a first insulation layer disposed on the sensing electrode and including at least one opening; and a second insulation layer disposed the first insulation layer, and having a higher refractive index than that of the first insulation layer, and the at least one opening overlaps at least one of the plurality of pixel openings in a plan view and does not overlap at least another one of the plurality of pixel openings in a plan view.

The first emission layer may include an organic material emitting red light, the second emission layer may include an organic material emitting green light, and the third emission layer may include an organic material emitting blue light.

The at least one opening may overlap at least part of the plurality of pixel openings that overlaps the first pixel electrode and at least part of the plurality of pixel openings that overlaps the third pixel electrode in a plan view, and the at least one opening may not overlap at least part of the plurality of pixel openings that overlaps the second pixel electrode in a plan view.

The first insulation layer may cover the entire pixel opening overlapping the second pixel electrode in a plan view.

The at least one opening may overlap the first pixel electrode, the first emission layer, the third pixel electrode, and the third emission layer in a plan view, and the at least one opening may not overlap the second pixel electrode and the second emission layer in a plan view.

According to the embodiments, light emission efficiency and display quality of the display device may be improved.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
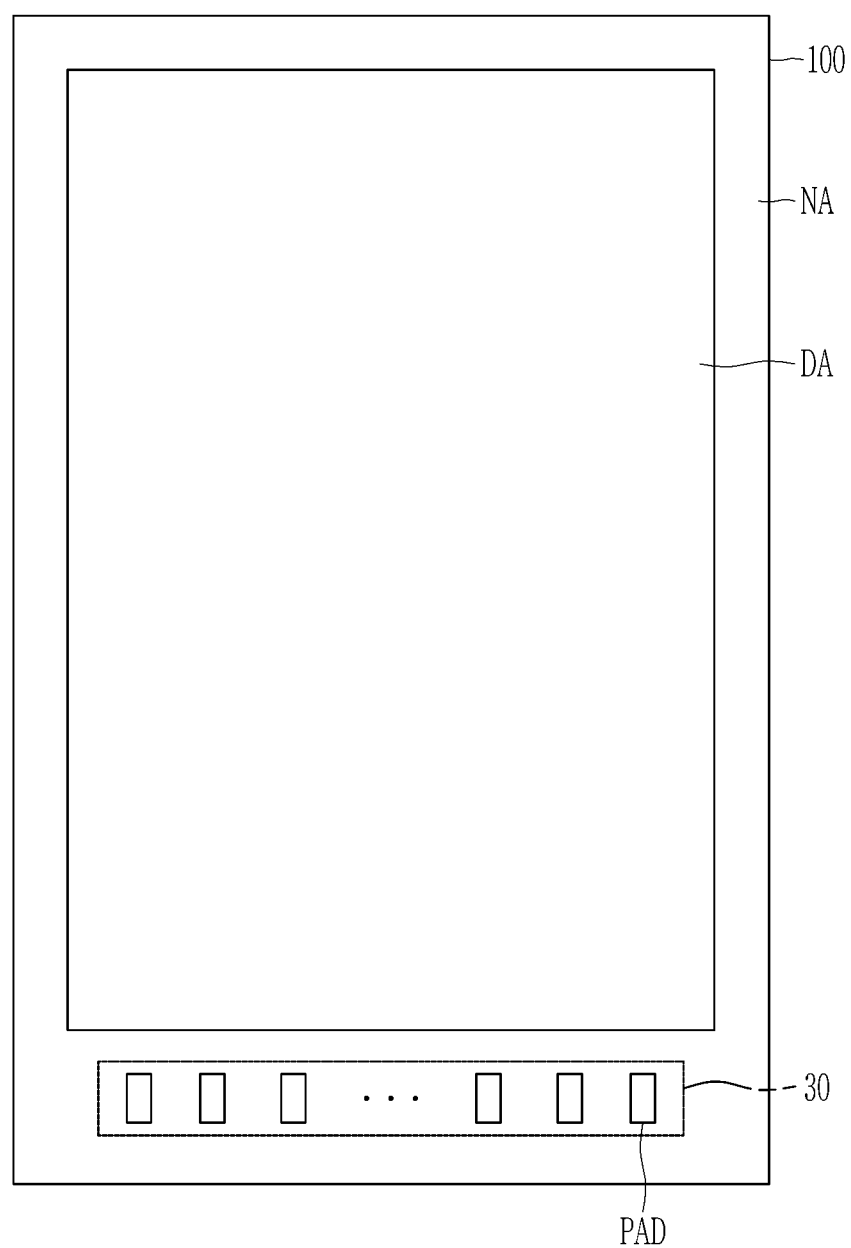
FIG. 1 is a schematic plan view of a display device according to an embodiment.

Hereinafter, embodiments will be described more fully with reference to the accompanying drawings, in which embodiments of the invention are shown. As those skilled in the art would realize, the described embodiments may be modified in various different ways.

The drawings and description are to be regarded as illustrative in nature and not restrictive. Like reference numerals designate like elements throughout the specification.

In addition, since the size and thickness of each configuration shown in the drawings are arbitrarily indicated for better understanding and ease of description, the disclosure is not necessarily limited to the drawings. In the drawings, the thickness of layers, films, panels, regions, etc., may be exaggerated for clarity. In addition, in the drawings, the thicknesses of some layers and regions may be exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" or "in a plan view" means viewing a target portion from the top, and the phrase "on a cross-section" or "in a cross-sectional view" means viewing a cross-section formed by vertically cutting a target portion from the side.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, referring to FIG. 1 and FIG. 2, a display device according to an embodiment will be described.

Figure 2:
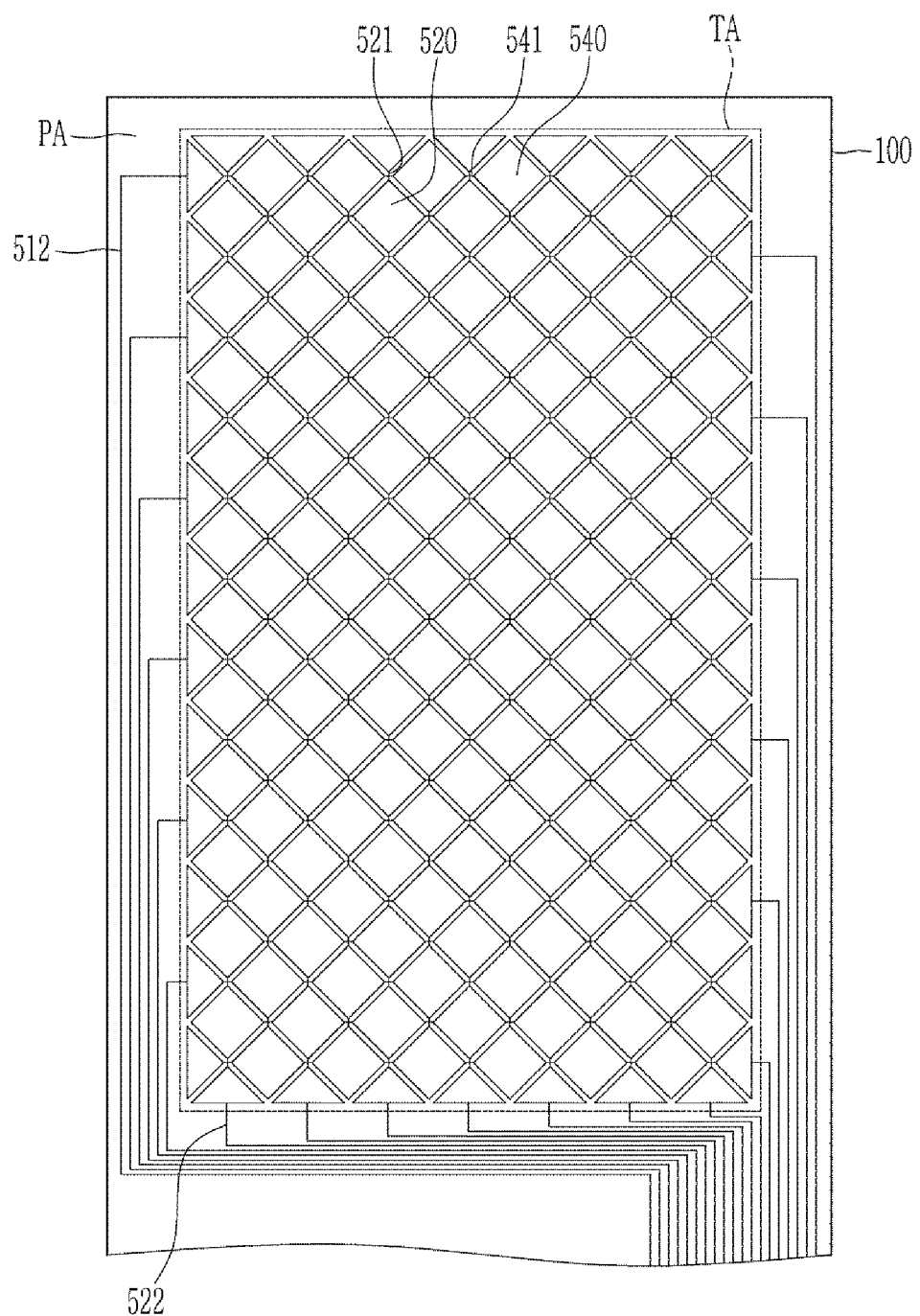
FIG. 2 is a schematic plan view of a portion including a detection portion in the display device according to the embodiment.

FIG. 1 is a schematic plan view of a display device according to an embodiment, and FIG. 2 is a schematic plan view of a portion including a detection portion in the display device according to the embodiment.

Referring to FIG. 1, a display device according to an embodiment may include a substrate 100 and a pad portion 30.

The substrate 100 may include a display area DA and a non-display area NA. The display area DA may be a region in which pixels (not shown in FIGS. 1 and 2) including a light emitting diode and a transistor are formed to display an image. The non-display area NA may be a region in which an image is not displayed. The non-display area NA may surround the display area DA. The non-display area NA may be a region including the pad portion 30 in which a pad PAD for applying a driving signal to the pixel is formed.

The pixels (not shown in FIGS. 1 and 2) including a transistor, a light emitting diode, or the like may be positioned in the display area DA. The pixels may be arranged in various shapes, for example, in a matrix format. A sensing area TA including sensing electrodes 520 and 540 (e.g., refer to FIG. 2) may be further positioned on an upper portion of the display area DA to recognize a touch (e.g., touch event).

In the non-display area NA, a driving voltage line (not shown), a driving low-voltage line (not shown), and the pad portion 30 for transmitting driving signals such as voltage and signal to the pixels formed in the display area DA may be positioned. Sensing wires 512 and 522 (e.g., refer to FIG. 2) may be further positioned in the non-display area NA. The sensing wires 512 and 522 may be electrically connected to the sensing electrodes 520 and 540. The sensing wires 512 and 522 and the sensing electrodes 520 and 540 will be further described with reference to FIG. 2.

The pad portion 30 is positioned on a portion of the non-display area NA, and includes pads PAD. A voltage, a signal, and the like may be applied to voltage lines (not shown) electrically connected to the display area DA through the pads PAD, the sensing wires 512 and 522 (refer to FIG. 2), and the like. A flexible printed circuit board (FPCB) (not shown) may be attached to the non-display area NA. The flexible printed circuit board (FPCB) may be electrically connected with the pad portion 30. The flexible printed circuit board (FPCB) and the pad portion 30 may be electrically connected by an anisotropic conductive film. The flexible printed circuit board (FPCB) may include a driver integrated chip (IC) (not shown), and a driving signal output from the driver IC may be supplied to each pixel through the pads PAD of the pad portion 30.

As shown in FIG. 2, the substrate 100 may further include a sensing area TA having sensing electrodes 520 and 540 formed on the display area DA and a peripheral area PA surrounding the sensing area TA. In embodiments, the sensing area TA may include at least part of the display area DA and the non-display area NA of FIG. 1, and the peripheral area PA may include an area excluding the sensing area TA in the non-display area NA of FIG. 1. For example, the peripheral area PA may include another portion of the non-display area NA of FIG. 1, which does not overlap the sensing area TA. However, positions of the sensing area TA and the peripheral area PA may be variously changed. For example, the sensing area TA may include a part of the display area DA, and the peripheral area PA may include a region excluding the sensing area TA in the display area DA and the non-display area NA. For example, the peripheral area PA may include another part of the display area DA and the non-display area NA. As another example, the sensing area TA may include a display area DA and a non-display area NA.

The sensing electrodes 520 and 540 may be positioned in the sensing area TA. The sensing electrodes 520 and 540 may include first sensing electrodes 520 and second sensing electrodes 540. The sensing electrodes 520 and 540 may be formed on the substrate 100 that is the same as the substrate 100 including the pixels. For example, the sensing electrodes 520 and 540 may be formed on the substrate 100 including the pixels. For example, pixels and sensing electrodes 520 and 540 may be positioned in a single panel.

The first sensing electrode 520 and the second sensing electrode 540 may be electrically isolated from each other. In embodiments, the first sensing electrode 520 may be a sensing input electrode, and the second sensing electrode 540 may be a sensing output electrode. However, the disclosure is not limited thereto, and the first sensing electrode 520 may be a sensing output electrode, and the second sensing electrode 540 may be a sensing input electrode.

The first sensing electrodes 520 and the second sensing electrodes 540 may be alternately disposed and not overlap each other in the sensing area TA in a plan view. Thus, the first sensing electrodes 520 and the second sensing electrodes 540 may be disposed in a mesh shape. The first sensing electrodes 520 may be arranged in plural along each of the column direction and the row direction, and the second sensing electrodes 540 may also be arranged in plural along each of the column direction and the row direction. The first sensing electrodes 520 may be electrically connected to each other in the column direction by first sensing electrode connection portions 521. The second sensing electrodes 540 may be electrically connected to each other in the row direction by second sensing electrode connection portions 541.

The first sensing electrode 520 and the second sensing electrode 540 may be positioned on a same layer. In embodiments, the first sensing electrode 520 and the second sensing electrode 540 may be positioned on different layers. The first sensing electrode 520 and the second sensing electrode 540 may have a rhombus shape, but are not limited thereto. The first sensing electrode 520 and the second sensing electrode 540 may have a polygonal shape such as a quadrangle or a hexagon, or a circular or oval shape. However, the disclosure is not limited thereto, and the first sensing electrode 520 and the second sensing electrode 540 may be implemented in various shapes, such as a protruding shape having a protruding portion to improve sensitivity of a sensing sensor. The first sensing electrode 520 and the second sensing electrode 540 may be formed of a transparent conductor or an opaque conductor. For example, the first sensing electrode 520 and the second sensing electrode 540 may include a transparent conductive oxide (TCO), and the transparent conductive oxide (TCO) may include at least one of an indium-tin oxide (ITO), an indium zinc oxide (IZO), a zinc oxide (ZnO), carbon nanotubes (CNT), and graphene. The first sensing electrode 520 and the second sensing electrode 540 may include openings. The openings formed on the sensing electrodes 520 and 540 serve to allow light emitted from the light emitting diode to be emitted to the front without interference.

First sensing electrodes 520 may be electrically connected to each other by a first sensing electrode connection portion 521 (also referred to as a bridge), and second sensing electrodes 540 may be electrically connected to each other by a second sensing electrode connection portion 541. In case that first sensing electrodes 520 are electrically connected in a first direction, the second sensing electrodes 540 may be electrically connected in a second direction that crosses the first direction. In case that the first sensing electrode 520 and the second sensing electrode 540 are positioned on a same layer, one of the first sensing electrode connection portion 521 and the second sensing electrode connection portion 541 may be positioned on a same layer as the first sensing electrode 520 and the second sensing electrode 540, and another one thereof may be positioned on a different layer from that of the first sensing electrode 520 and the second sensing electrode 540. As a result, the first sensing electrodes 520 and the second sensing electrodes 540 may be electrically disconnected or separated (or insulated). The another one of the first sensing electrode connection portion 521 and the second sensing electrode connection portion 541 positioned on another layer may be positioned on an upper or lower layer of the first sensing electrode 520 and the second sensing electrode 540. In an embodiment described below, the another one of the first sensing electrode connection portion 521 and the second sensing electrode connection portion 541 may be positioned on the lower layer (e.g., layer closer to the substrate 100 than the first sensing electrode 520 and second sensing electrode 540), and thus will be mainly described.

The sensing wires 512 and 522 electrically connected to the first sensing electrodes 520 and the second sensing electrodes 540 may be positioned in the peripheral area PA, respectively. The sensing wires 512 and 522 may include first sensing wires 512 and second sensing wires 522. The first sensing wire 512 may be electrically connected to the second sensing electrodes 540 disposed in the row direction, and the second sensing wire 522 may be electrically connected to the first sensing electrodes 520 disposed in the column direction. In embodiments, the first sensing wire 512 and the second sensing wire 522 may be electrically connected to some of the pads PAD included in the pad portion 30 of FIG. 1.

In FIG. 2, a sensing portion of a mutual-cap type for sensing touch (or touch event) using two sensing electrodes 520 and 540 is illustrated. However, in embodiments, the sensing portion may also be formed as or implemented with, for example, a sensor of a self-cap type that senses touch (or touch event) using only one sensing electrode.

Hereinafter, referring to FIG. 3 to FIG. 7, an arrangement form of the respective pixels in the display device according to the embodiment will be described.

Figure 3:
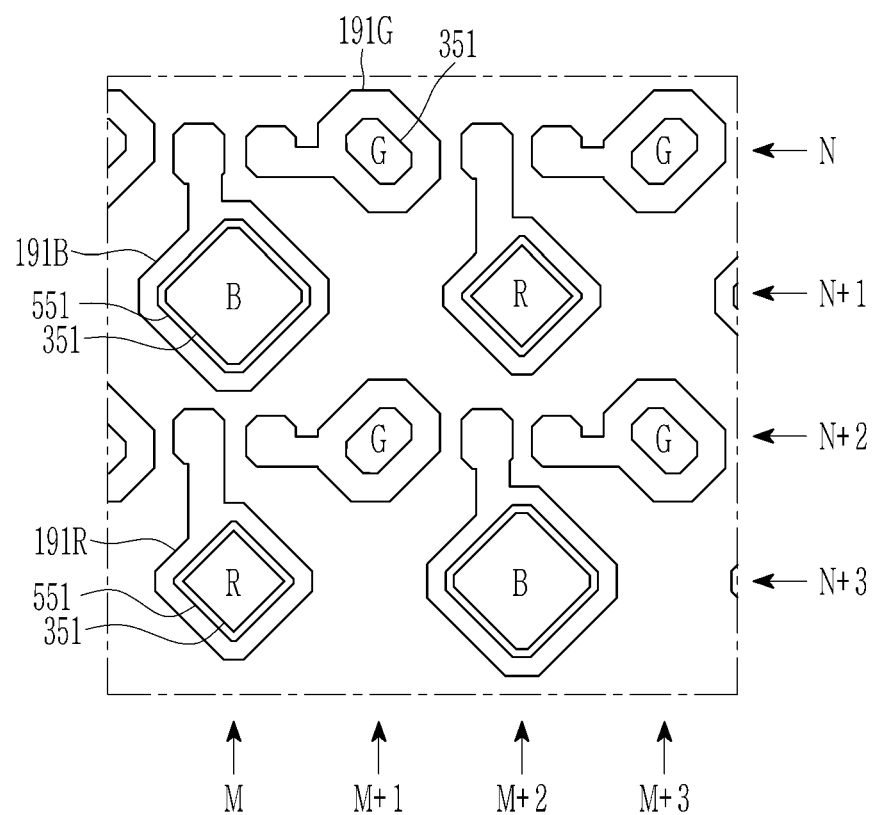
FIG. 3 is a schematic plan view of a part of a display device according to an embodiment.
Figure 4:
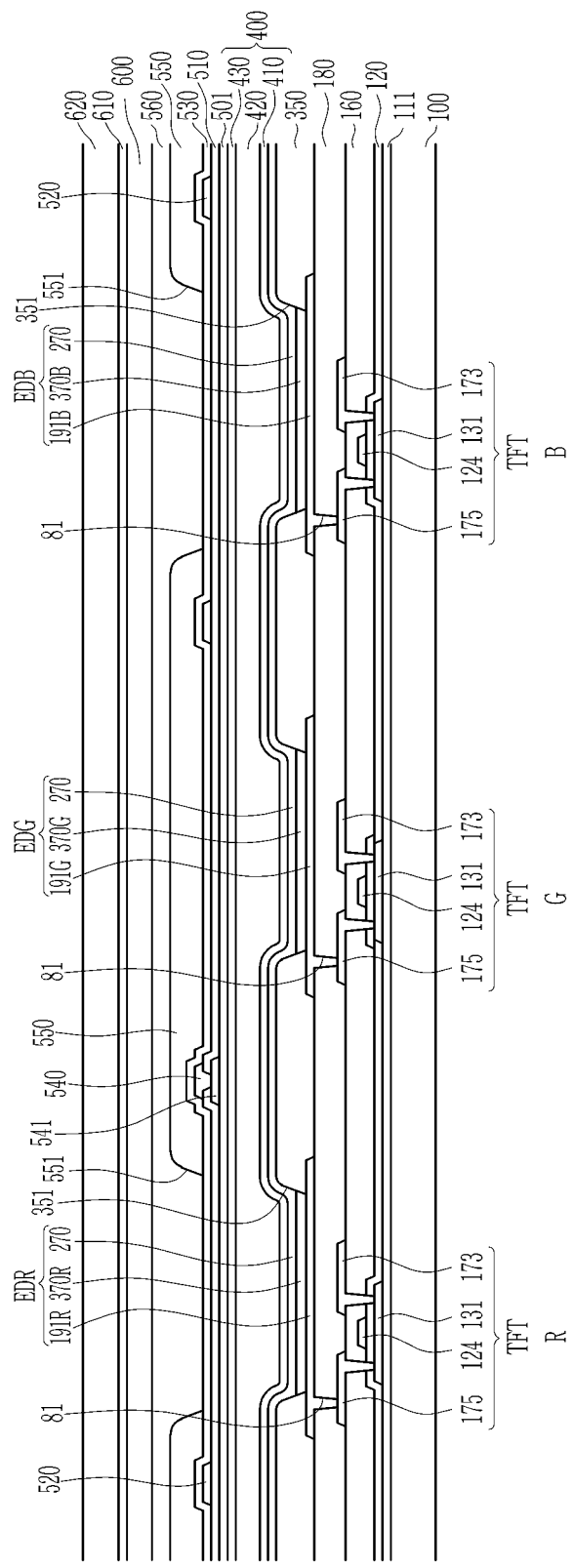
FIG. 4 is a schematic cross-sectional view of a part of the display device according to the embodiment.
Figure 5:
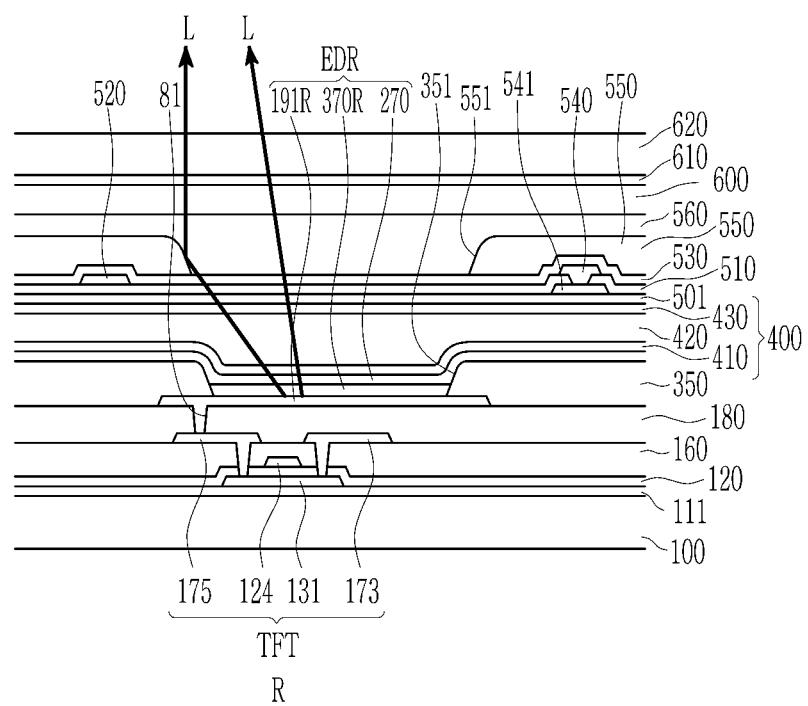
FIG. 5 is a schematic cross-sectional view of the first pixel and the periphery of the first pixel of the display device according to the embodiment.
Figure 6:
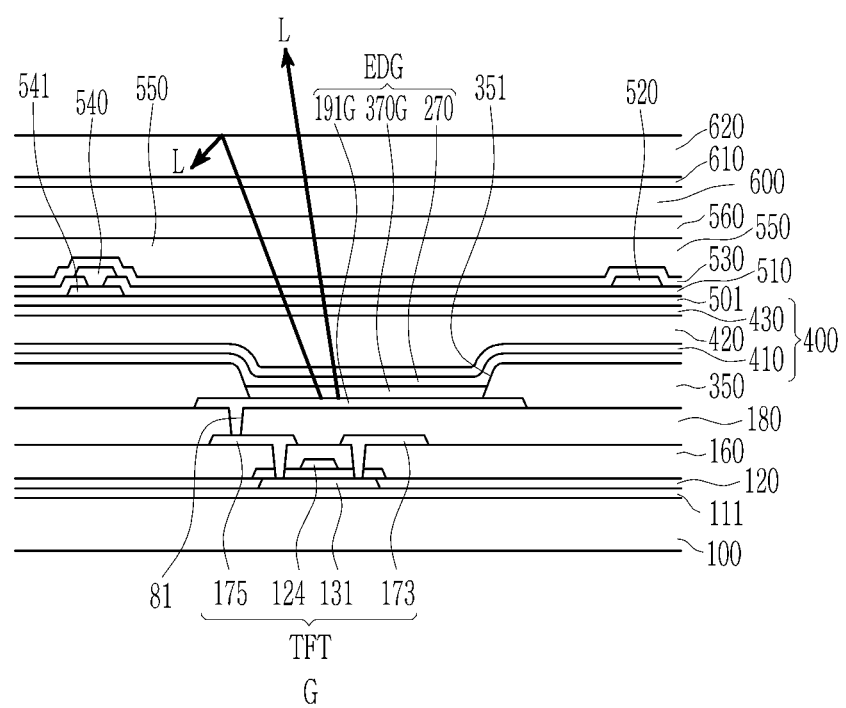
FIG. 6 is a schematic cross-sectional view of a second pixel and the periphery of the second pixel of the display device according to the embodiment.
Figure 7:
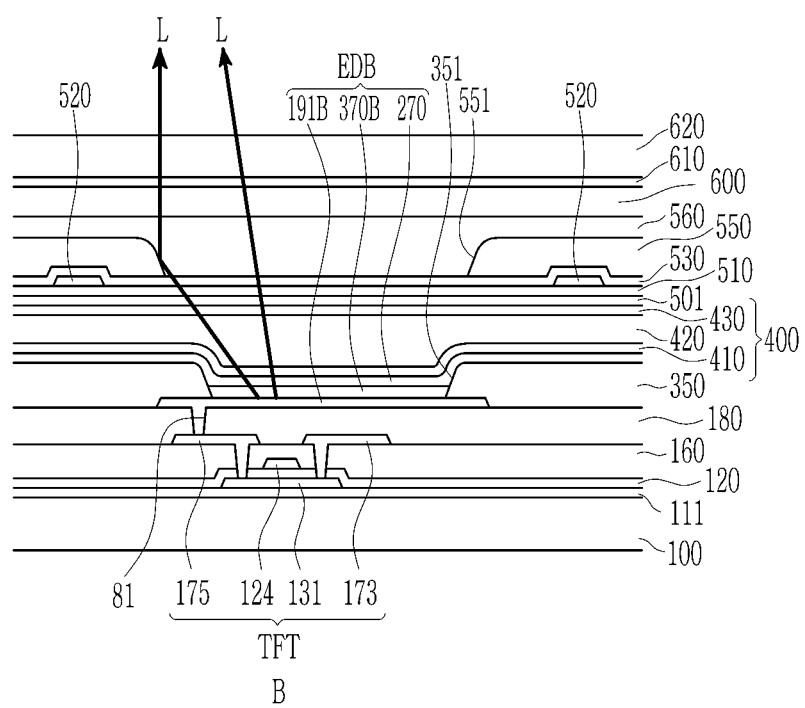
FIG. 7 is a schematic cross-sectional view of a third pixel and the periphery of the third pixel of the display device according to the embodiment.

FIG. 3 is a schematic plan view of a part of a display device according to an embodiment, and FIG. 4 is a schematic cross-sectional view of a part of the display device according to the embodiment. FIG. 5 is a schematic cross-sectional view of the first pixel and the periphery of the first pixel of the display device according to the embodiment, FIG. 6 is a schematic cross-sectional view of a second pixel and the periphery of the second pixel of the display device according to the embodiment, and FIG. 7 is a schematic cross-sectional view of a third pixel and the periphery of the third pixel of the display device according to the embodiment.

Referring to FIGS. 3 to 7, a display device according to an embodiment may include pixels R, G, and B. The pixels R, G, and B may include a first pixel R, a second pixel G, and a third pixel B. The first pixel R may display red, the second pixel G may display green, and the third pixel B may display blue. However, this is only an example, and pixels may further include pixels displaying other colors in addition to red, green, and blue. For example, the display device may further include white pixels. As another example, the display device may include a pixel for displaying cyan, a pixel for displaying magenta, and a pixel for displaying yellow.

In the display area DA of the substrate 100 of the display device according to the embodiment, a transistor TFT including a semiconductor 131, a gate electrode 124, a source electrode 173, and a drain electrode 175, a gate insulating layer 120, a first interlayer insulating layer 160, a second interlayer insulating layer 180, pixel electrodes 191R, 191G, and 191B, emission layers 370R, 370G, and 370B, a bank layer 350, a common electrode 270, and an encapsulation layer 400 may be positioned in each of the pixels R, G, and B. The pixel electrodes 191R, 191G, and 191B, the emission layers 370R, 370G, and 370B, and the common electrode 270 may form light emitting elements EDR, EDG, and EDB. The display device according to the embodiment may further include a sensing area TA that is positioned above the display area DA, and the sensing area TA may include a first sensing insulation layer 510, a second sensing insulation layer 530, sensing electrodes 520 and 540, and a second sensing electrode connection portion 541. The display device according to the embodiment may further include a first insulation layer 550 and a second insulation layer 560 disposed above the sensing area TA.

The substrate 100 may include a material having a rigid characteristic, such as glass, or a flexible material that may be bent, such as a plastic or a polyimide. On the substrate 100, a buffer layer 111 for planarizing a surface of the substrate 100 and blocking the penetration of impure elements (or impurities) may be further positioned. The buffer layer 111 may include an inorganic material. For example, the buffer layer 111 may include an inorganic insulating material such as a silicon nitride ($SiN_x$), a silicon oxide ($SiO_x$), or a silicon oxynitride ($SiO_xN_y$). The buffer layer 111 may be a single layer or multi-layered structure of the above-described materials. A barrier layer (not shown) may be further positioned on the substrate 100. In this case, the barrier layer may be positioned between the substrate 100 and the buffer layer 111. The barrier layer may include an inorganic insulating material such as a silicon nitride ($SiN_x$), a silicon oxide ($SiO_x$), or a silicon oxynitride ($SiO_xN_y$). The barrier layer may have a single layer or multi-layered structure of the above-described materials.

The semiconductor 131 may be positioned on the substrate 100. For example, the semiconductor 131 may be disposed on the buffer layer 111. The semiconductor 131 may include at least one of amorphous silicon, polysilicon, and an oxide semiconductor. For example, the semiconductor 131 may contain low temperature polysilicon (LTPS) or an oxide semiconductor material containing at least one of zinc (Zn), indium (In), gallium (Ga), tin (Sn), and a mixture thereof. For example, the semiconductor 131 may include an indium-gallium-zinc oxide (IGZO). The semiconductor 131 may include a channel region, a source region, and a drain region that are classified according to whether or not impurity doping is performed. The source region and drain region may have conduction characteristics corresponding to a conductor.

The gate insulating layer 120 may cover (or overlap) the semiconductor 131 and the substrate 100. For example, the gate insulating layer 120 may cover the semiconductor 131 and the buffer layer 111. The gate insulating layer 120 may include at least one inorganic insulating material such as a silicon nitride ($SiN_x$), a silicon oxide ($SiO_x$), or a silicon oxynitride ($SiO_xN_y$). The gate insulating layer 120 may have a single-layer or multi-layered structure of the above-described materials.

The gate electrode 124 may be positioned over the gate insulating layer 120. The gate electrode 124 may include a metal or a metal alloy such as copper (Cu), molybdenum (Mo), aluminum (Al), silver (Ag), chromium (Cr), tantalum (Ta), and titanium (Ti). The gate electrode 124 may include a metal alloy of the above-described metals. The gate electrode 124 may be formed as a single layer or multiple layers. A region overlapping the gate electrode 124 in a plan view among the semiconductor 131 may be a channel region.

The first interlayer insulating layer 160 may cover the gate electrode 124 and the gate insulating layer 120. The first interlayer insulating layer 160 may include an inorganic insulating material such as a silicon nitride ($SiN_x$), a silicon oxide ($SiO_x$), or a silicon oxynitride ($SiO_xN_y$). The first interlayer insulating layer 160 may have a single-layer or multi-layered structure of the above-described materials.

The source electrode 173 and the drain electrode 175 may be positioned on the first interlayer insulating layer 160. The source electrode 173 and the drain electrode 175 may be electrically connected to the source region and the drain region of the semiconductor 131 by openings (e.g., contact holes) formed through the first interlayer insulating layer 160 and the gate insulating layer 120, respectively. The aforementioned semiconductor 131, gate electrode 124, source electrode 173, and drain electrode 175 form one transistor TFT. In embodiments, the transistor TFT may include only the source region and the drain region of the semiconductor 131 instead of the source electrode 173 and the drain electrode 175. Although the transistor TFT is provided in each of the pixels R, G, and B, multiple transistors TFT may be positioned in each of the pixels R, G, and B.

The source electrode 173 and the drain electrode 175 may contain at least one metal of aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like, or a metal alloy. The source electrode 173 and the drain electrode 175 may be formed as a single layer or multiple layers. The source electrode 173 and the drain electrode 175 according to the embodiment may be formed of a triple layer including an upper layer, an intermediate layer, and a lower layer. For example, the upper layer and the lower layer of the triple layer may include titanium (Ti), and the middle layer of the triple layer may include aluminum (Al).

The second interlayer insulating layer 180 may be positioned on the source electrode 173 and the drain electrode 175. The second interlayer insulating layer 180 may cover the source electrode 173, the drain electrode 175, and the first interlayer insulating layer 160. The second interlayer insulating layer 180 may planarize a surface of the substrate 100 provided with a transistor TFT. The second interlayer insulating layer 180 may be, for example, an organic insulator and may include at least one material selected from a group consisting of polyimide, polyamide, acryl resin, benzocyclobutene, and phenol resin.

The pixel electrodes 191R, 191G, and 191B may be positioned on a second interlayer insulating layer 180. A first pixel electrode 191R may be positioned in a first pixel R, a second pixel electrode 191G may be positioned in a second pixel G, and a third pixel electrode 191B may be positioned in a third pixel B. The pixel electrodes 191R, 191G, and 191B may also be referred to as anodes, and may be formed of a single layer including a transparent conductive oxide film or a metallic material, or multiple layers including these. The transparent conductive oxide film of the pixel electrodes 191R, 191G, and 191B may include at least one of indium tin oxide (ITO), poly-ITO, indium zinc oxide (IZO), indium gallium zinc oxide (IGZO), and indium tin zinc oxide (ITZO). The metallic material of the pixel electrodes 191R, 191G, and 191B may include at least one of silver (Ag), molybdenum (Mo), copper (Cu), gold (Au), and aluminum (Al).

The second interlayer insulating layer 180 may include a via hole 81 exposing the drain electrode 175. The drain electrode 175 and the pixel electrodes 191R, 191G, and 191B may be physically and electrically connected through the via hole 81 of the second interlayer insulating layer 180. Accordingly, the pixel electrodes 191R, 191G, and 191B may receive an output current transferred from the drain electrode 175 to the emission layers 370R, 370G, and 370B.

The bank layer 350 may be positioned on the pixel electrodes 191R, 191G, and 191B and the second interlayer insulating layer 180. The bank layer 350 may also be referred to as a pixel defining layer PDL, and include a pixel opening 351 overlapping at least a portion of pixel electrodes 191R, 191G, and 191B in a plan view. In this case, the pixel opening 351 may overlap central portions of the pixel electrodes 191R, 191G, and 191B in a plan view, and may not overlap edge portions of the pixel electrodes 191R, 191G, and 191B in a plan view. Accordingly, a size of the pixel opening 351 may be smaller than a size of each of the pixel electrodes 191R, 191G, and 191B. The bank layer 350 may partition formation positions (e.g., partition walls or banks) of emission layers 370R, 370G, and 370B such that the emission layers 370R, 370G, and 370B may be positioned on a portion where the upper surfaces of the pixel electrodes 191R, 191G, and 191B are exposed. The bank layer 350 may be an organic insulator including at least one material selected from the group consisting of polyimide, polyamide, acryl resin, benzocyclobutene, and phenol resin. In embodiments, the bank layer 350 may be formed as or implemented with, for example, a black pixel define layer (BPDL) including a black color pigment.

The pixel openings 351 may each have a shape similar to that of the pixel electrodes 191R, 191G, and 191B in a plan view. For example, the pixel opening 351 and pixel electrodes 191R, 191G, and 191B may be formed in the shape of a polygon in a plan view. In this case, corner portions of the pixel opening 351 and pixel electrodes 191R, 191G, and 191B may be chamfered. However, the shape of the pixel opening 351 and the shape of the pixel electrodes 191R, 191G, and 191B are not limited thereto, and may be variously changed.

The pixel electrodes 191R, 191G, and 191B corresponding to each of the first pixel R, the second pixel G, and the third pixel B may have different sizes in a plan view. Similarly, the pixel openings 351 corresponding to each of the first pixel R, the second pixel G, and the third pixel B may have different sizes in a plan view. For example, the pixel opening 351 and the first pixel electrode 191R corresponding to the first pixel R may have larger sizes than those of the pixel opening 351 and the second pixel electrode 191G corresponding to the second pixel G in a plan view, respectively. The pixel opening 351 and the first pixel electrode 191R corresponding to the first pixel R may have sizes that are smaller than or similar to those of the pixel opening 351 and the third pixel electrode 191B corresponding to the third pixel B in a plan view, respectively. However, the disclosure is not limited thereto, and each of the pixel opening 351 and the pixel electrodes 191R, 191G, and 191B may have various sizes.

The pixels of the display device according to the embodiment may be disposed along the row direction and the column direction. For example, the second pixel electrodes 191G may be spaced apart from each other at a predetermined (or selected) interval in an N-th row, and the third pixel electrode 191B and the first pixel electrode 191R may be alternately disposed in an adjacent (N+1)th row. Similarly, the second pixel electrodes 191G may be spaced apart from each other by a predetermined interval in an adjacent (N+2)th row, and the first pixel electrode 191R and the third pixel electrode 191B may be alternately disposed in an adjacent (N+3)th row.

Second pixel electrodes 191G disposed in the N-th row may be disposed to cross (or intersect) each other with the third pixel electrode 191B and first pixel electrode 191R disposed in the N-th row. For example, the third pixel electrode 191B and the first pixel electrode 191R may be alternately disposed in an M-th column, and second pixel electrodes 191G may be disposed at a predetermined interval in an adjacent (M+1)th column. Similarly, the first pixel electrode 191R and the third pixel electrode 191B may be alternately disposed in an adjacent (M+2)th column, and second pixel electrodes 191G may be disposed in an adjacent (M+3)th column and spaced apart from each other by a predetermined interval. For example, pixel electrodes 191R, 191G, and 191B may be repeatedly disposed on the substrate 100 in the above-described structure.

Each of the emission layers 370R, 370G, and 370B may be positioned within the pixel opening 351 partitioned by the bank layer 350. The emission layers 370R, 370G, and 370B may include an organic material that emits light such as red, green, and blue. The emission layers 370R, 370G, and 370B that emit red, green, and blue light may contain an organic material of low molecular weight or high molecular weight. In the first pixel R, the first emission layer 370R may be positioned on the first pixel electrode 191R. The first emission layer 370R may include an organic material that emits red light. In the second pixel G, the second emission layer 370G may be positioned on the second pixel electrode 191G. The second emission layer 370G may include an organic material that emits green light. In third pixel B, the third emission layer 370B may be positioned on the third pixel electrode 191B. The third emission layer 370B may include an organic material that emits blue light.

In FIGS. 4 to 7, the emission layers 370R, 370G, and 370B are illustrated as a single layer, but substantially, an auxiliary layer such as an electron injection layer, an electron transport layer, a hole transport layer, and a hole injection layer may also be included above and/or below each of the emission layers 370R, 370G, and 370B. The hole injection layer and the hole transport layer may be positioned below the emission layers 370R, 370G, and 370B, and the electron transport layer and the electron injection layer may be positioned above the emission layers 370R, 370G, and 370B.

Other emission layers may be further positioned on the emission layers 370R, 370G, and 370B. For example, a fourth emission layer may be further positioned on the first emission layer 370R, and the fourth emission layer may emit light having a wavelength substantially equivalent to that of the first emission layer 370R. A fifth emission layer may be further positioned on the second emission layer 370G, and the fifth emission layer may emit light having a wavelength substantially equivalent to that of the second emission layer 370G. A sixth emission layer may be further positioned on the third emission layer 370B, and the sixth emission layer may emit light having a wavelength substantially equivalent to that of the third emission layer 370B. It has been described in the above case that the two emission layers overlap each other in a plan view, but is not limited thereto. For example, three or more emission layers may be stacked and formed.

Although not shown, a spacer may be further positioned on the bank layer 350. The spacer and the bank layer 350 may include a same material. However, the disclosure is not limited thereto, and the spacer may be formed of a different material from that of the bank layer 350. The spacer may be an organic insulator containing at least one material selected from a group consisting of polyimide, polyamide, acryl resin, benzocyclobutene, and phenol resin.

The common electrode 270 may be positioned on the bank layer 350 and the emission layers 370R, 370G, and 370B. A common electrode 270 of each pixel R, G, and B may be electrically connected to each other. The common electrode 270 may be connected to the substrate 100 as a whole. The common electrode 270 may also be referred to as a cathode, and may be formed of a transparent conductive layer including at least one of an indium tin oxide (ITO), an indium zinc oxide (IZO), an indium gallium zinc oxide (IGZO), and an indium tin zinc oxide (ITZO). The common electrode 270 may be formed of at least one metallic material such as silver (Ag) or magnesium (Mg), or a mixture thereof. A thickness of the common electrode 270 may be adjusted to form a transparent conductive layer. For example, the thickness of the common electrode 270 including the metallic material may be decreased, and the common electrode 270 may transmit light. For example, the common electrode 270 may have a translucent characteristic, and a microcavity may be formed together with the pixel electrodes 191R, 191G, and 191B. According to the microcavity structure, light of a specific wavelength may be emitted to an upper portion of the display device by the spacing and characteristics between both electrodes, and the result can be displayed in red, green, or blue.

The pixel electrodes 191R, 191G, and 191B, the emission layers 370R, 370G, and 370B, and the common electrode 270 may form light emitting elements EDR, EDG, and EDB. In the first pixel R, the first pixel electrode 191R, the first emission layer 370R, and the common electrode 270 may form a first light emitting element EDR emitting red light. A portion where the first pixel electrode 191R, the first emission layer 370R, and the common electrode 270 overlap one another may be a light emitting region of the first light emitting element EDR in a plan view. In the second pixel G, the second pixel electrode 191G, the second emission layer 370G, and the common electrode 270 may form a second light emitting element EDG emitting green light. A portion where the second pixel electrode 191G, the second emission layer 370G, and the common electrode 270 overlap one another may be a light emitting region of the second light emitting element EDG in a plan view. In the third pixel B, the third pixel electrode 191B, the third emission layer 370B, and the common electrode 270 may form a third light emitting element EDB emitting blue light. A portion where the third pixel electrode 191B, the third emission layer 370B, and the common electrode 270 overlap one another may be a light emitting region of the third light emitting element EDB in a plan view.

An encapsulation layer 400 may be positioned over the common electrode 270. The encapsulation layer 400 may include at least one inorganic layer and at least one organic layer. In the embodiment, the encapsulation layer 400 may include a first inorganic encapsulation layer 410, an organic encapsulation layer 420, and a second inorganic encapsulation layer 430. However, this is only an example, and the number of inorganic and organic layers forming the encapsulation layer 400 may be variously changed. For example, the encapsulation layer 400 may be stacked in the order of a first inorganic encapsulation layer, a second inorganic encapsulation layer, a first organic encapsulation layer, and a third inorganic encapsulation layer. In another example, the encapsulation layer 400 may be stacked in the order of a first inorganic encapsulation layer, a first organic encapsulation layer, a second inorganic encapsulation layer, and a third inorganic encapsulation layer. The first inorganic encapsulation layer 410, the organic encapsulation layer 420, and the second inorganic encapsulation layer 430 may be positioned in at least part of the display area DA and the non-display area NA. In embodiments, the organic encapsulation layer 420 may be formed around the display area DA, and the first inorganic encapsulation layer 410 and the second inorganic encapsulation layer 430 may be formed up to the non-display area NA. The encapsulation layer 400 may protect the light emitting elements EDR, EDG, and EDB from moisture or oxygen that may inflow from the outside, and an end of the first inorganic encapsulation layer 410 and the second inorganic encapsulation layer 430 may be formed to directly contact each other.

A buffer layer 501 may be positioned on the encapsulation layer 400. The buffer layer 501 may be formed as or implemented with, for example, an inorganic insulating layer. An inorganic material included in the inorganic insulating layer of the buffer layer 501 may be at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. In embodiments, the buffer layer 501 may be omitted.

The second sensing electrode connection portion 541, the first sensing insulation layer 510, and the sensing electrodes 520 and 540 may be positioned on the buffer layer 501.

Although it is not illustrated, the first sensing electrode connection portion 521 (e.g., refer to FIG. 2) may be disposed on the buffer layer 501. One of the first sensing electrode connection portion 521 (e.g., refer to FIG. 2) and the second sensing electrode connection portion 541 may be disposed on the same layer as the sensing electrodes 520 and 540, and the other may be disposed on a different layer from the sensing electrodes 520 and 540. Hereinafter, an example in which the second sensing electrode connection portion 541 is positioned on a different layer from the sensing electrodes 520 and 540 will be described.

The second sensing electrode connection portion 541, the first sensing insulation layer 510, and the sensing electrodes 520 and 540 may form a sensing sensor. The sensing sensor may be classified into a resistive type, a capacitive type, an electro-magnetic type, an optical type, and the like. The sensing sensor according to the embodiment may use a sensor of a capacitance type.

The second sensing electrode connection portion 541 may be positioned on the buffer layer 501, and the first sensing insulation layer 510 may be positioned on the buffer layer 501 and the second sensing electrode connection portion 541. The first sensing insulation layer 510 may include an inorganic insulating material or an organic insulating material. The inorganic insulating material of the first sensing insulation layer 510 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic insulating material of the first sensing insulation layer 510 may include at least one of acryl-based resin, methacrylic resin, polyisoprene, vinyl-based resin, epoxy-based resin, urethane-based resin, cellulose-based resin, and perylene-based resin.

The sensing electrodes 520 and 540 may be positioned on the first sensing insulation layer 510. The sensing electrodes 520 and 540 may include first sensing electrodes 520 and second sensing electrodes 540. The first sensing electrode 520 and the second sensing electrode 540 may be electrically insulated. The first sensing insulation layer 510 may include an opening (e.g., contact hole) exposing an upper surface of the second sensing electrode connection portion 541, and the second sensing electrode connection portion 541 may be electrically connected to the second sensing electrode 540 and thus can electrically connect two adjacent second sensing electrodes 540 through the opening of the first sensing insulation layer 510. The first sensing electrode connection portion 521 for connecting the first sensing electrode 520, the first sensing electrode 520, and the second sensing electrode 540 may be formed on the same layer.

The sensing electrodes 520 and 540 may contain a conducting material with good conductivity. For example, the sensing electrodes 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The sensing electrodes 520 and 540 may be formed of a single layer or multiple layers. The sensing electrodes 520 and 540 may include an opening and thus light emitted from the light emitting diode is emitted upward without interference. In embodiments, the sensing electrodes 520 and 540 may be formed as a triple layer including an upper layer, an intermediate layer, and a lower layer. For example, the upper layer and the lower layer of the triple layer may include titanium (Ti), and the middle layer of the triple layer may include aluminum (Al).

The second sensing insulation layer 530 may be disposed on the sensing electrodes 520 and 540 and the first sensing insulation layer 510. The second sensing insulation layer 530 may include an inorganic insulating material or an organic insulating material. The inorganic insulating material of the second sensing insulation layer 530 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic insulating material of the second sensing insulation layer 530 may include at least one of acryl-based resin, methacrylic resin, polyisoprene, vinyl-based resin, epoxy-based resin, urethane-based resin, cellulose-based resin, and perylene-based resin.

A first insulation layer 550 may be disposed on the second sensing insulation layer 530. The first insulation layer 550 may include a light-transmitting organic insulating material having a low refractive index. For example, the first insulation layer 550 may include at least one of acryl (acrylic) resin, polyimide resin, polyamide resin, and Alq3 [Tris (8-hydroxyquinolinato)aluminum]. The first insulation layer 550 may have a relatively smaller refractive index than that of the second insulation layer 560, which will be described below. For example, the first insulation layer 550 may have a refractive index in a range of about 1.40 to about 1.59. A thickness of the first insulation layer 550 may be in a range of about 2.0 μm to about 3.5 μm.

The first insulation layer 550 may include an opening 551. The opening 551 may mean a part where the second sensing insulation layer 530 is not covered by the first insulation layer 550. The opening 551 of the first insulation layer 550 may overlap the pixel opening 351 of some (or portion of) pixels R, G, and B in a plan view. The opening 551 of the first insulation layer 550 may be larger than the pixel opening 351, and may be formed in a shape surrounding the pixel opening 351. In the specification, the opening 551 and the pixel opening 351 may be used as a singular form, however, the opening 551 and the pixel opening 351 may also be understood as multiple openings 551 and multiple pixel openings 351, respectively.

The opening 551 of the first insulation layer 550 may overlap some of pixels R, G, and B, and may not overlap some other of pixels R, G, and B in a plan view. For example, the opening 551 of the first insulation layer 550 may overlap at least one of the first pixel R, the second pixel G, and the third pixel B, and may not overlap at least another one of the first pixel R, the second pixel G, and the third pixel B in a plan view. Accordingly, the opening 551 of the first insulation layer 550 may overlap at least one of a first light emitting element EDR, a second light emitting element EDG, and a third light emitting element EDB, and may not overlap at least another one thereof in a plan view. The opening 551 of the first insulation layer 550 may overlap at least one of the first pixel electrode 191R, the second pixel electrode 191G, and the third pixel electrode 191B, and may not overlap the at least another one thereof in a plan view. The opening 551 of the first insulation layer 550 may overlap the pixel opening 351 positioned in at least one of the first pixel R, the second pixel G and the third pixel B, and may not overlap the pixel opening 351 positioned in at least the another one thereof in a plan view. The opening 551 of the first insulation layer 550 may overlap at least one of the first emission layer 370R, the second emission layer 370G, and the third emission layer 370B, and may not overlap the at least another one thereof in a plan view.

For example, the opening 551 of the first insulation layer 550 may overlap the first pixel R and the third pixel B in a plan view, and may not overlap the second pixel G in a plan view. Accordingly, in the first pixel R and the third pixel B, at least a portion of the second sensing insulation layer 530 may not be covered by the first insulation layer 550, but may be exposed. The second sensing insulation layer 530 exposed by the opening 551 in the first pixel R and the third pixel B may be in contact with the second insulation layer 560. In the second pixel G, the entire second sensing insulation layer 530 may be covered (or overlapped) by the first insulation layer 550, and the second sensing insulation layer 530 may not be exposed. The opening 551 of the first insulation layer 550 may overlap the first light emitting element EDR and the third light emitting element EDB, and may not overlap the second light emitting element EDG in a plan view. At least a portion of the first light emitting element EDR and the third light emitting element EDB may not be covered by the first insulation layer 550, and the second light emitting element EDG may be entirely covered by the first insulation layer 550. The opening 551 of the first insulation layer 550 may overlap the first pixel electrode 191R and the third pixel electrode 191B, and may not overlap the second pixel electrode 191G in a plan view. The opening 551 of the first insulation layer 550 may overlap the pixel opening 351 positioned at the first pixel R and the pixel opening 351 positioned at the third pixel B, and may not overlap the pixel opening 351 positioned at the second pixel G in a plan view. The opening 551 of the first insulation layer 550 may overlap the first emission layer 370R and the third emission layer 370B, and may not overlap the second emission layer 370G in a plan view.

In the first pixel R and third pixel B, a separation distance between the pixel opening 351 and the opening 551 of the first insulation layer 550 may be constant. The separation distance between the pixel opening 351 and the opening 551 of the first insulation layer 550 may mean the shortest distance between an edge of the pixel opening 351 and an edge of the opening 551. The edge of the pixel opening 351 may mean a point where the edge of the bank layer 350 contacts the pixel electrodes 191R, 191G, and 191B. The edge of the opening 551 may mean a point where the edge of the first insulation layer 550 is in contact with the second sensing insulation layer 530. The separation distance between the pixel opening 351 and the opening 551 of the first insulation layer 550 may be in a range of about 0.5 μm to about 3.0 μm. In the embodiment, the separation distance between the pixel opening 351 and the opening 551 of the first insulation layer 550 may be constant, but is not limited thereto. The separation distance between the pixel opening 351 and the opening 551 of the first insulation layer 550 in the first pixel R and the third pixel B may be different depending on the position thereof. A separation distance between the pixel opening 351 in the first pixel R and the opening 551 of the first insulation layer 550 may be different from a separation distance between the pixel opening 351 in the third pixel B and the opening 551 of the first insulation layer 550.

A second insulation layer 560 may be positioned on the second sensing insulation layer 530 and the first insulation layer 550. The second insulation layer 560 may include a light-transmitting organic insulating material having a high refractive index. The second insulation layer 560 may have a relatively larger refractive index than that of the first insulation layer 550. For example, the second insulation layer 560 may have a refractive index in a range of about 1.60 to about 1.80.

The second insulation layer 560 may be positioned within the opening 551 of the first insulation layer 550. The second insulation layer 560 may be in contact with (or may contact) a side surface of the first insulation layer 550. Furthermore, the second insulation layer 560 may be positioned on an upper surface of the first insulation layer 550 so as to be in contact with the upper surface of the first insulation layer 550.

After the opening 551 is formed on the first insulation layer 550, a material having a high refractive index may be applied as a whole on the first insulation layer 550 by an inkjet method, and a curing process may be performed to form a second insulation layer 560. The highly refractive index material may have fluidity and may move. Thus, the high refractive index material may migrate into the opening 551 of the first insulation layer 550 and fill the opening 551. However, a part of the opening 551 of the first insulation layer 550 may not be filled with a high refractive index material. The smaller the size of the opening 551 of the first insulation layer 550, the higher the probability that the high refractive index material cannot enter. The second pixel G may have a relatively small size compared to the first pixel R and the third pixel B. In the embodiment, the opening 551 of the first insulation layer 550 overlaps the first pixel R and the third pixel B in a plan view, but does not overlap the second pixel G in a plan view. In case that the opening 551 of the first insulation layer 550 overlaps the second pixel G, the size of the opening 551 may be relatively small compared to other pixels. Therefore, the high refractive index material may not be filled in the opening 551 overlapping the second pixel G. In the embodiment, the opening 551 of the first insulation layer 550 may not overlap the second pixel G having a relatively small size in a plan view, but may overlap the first pixel R and the third pixel B having a relatively large size in a plan view. Therefore, the high refractive index material may be properly filled in the opening 551 of the first insulation layer 550 overlapping the first pixel R and the third pixel B. For example, it is possible to solve a problem that the second insulation layer 560 is not formed in some of the opening 551 of the first insulation layer 550.

The thicker the thickness of the first insulation layer 550, the higher the barrier for the high refractive index material to enter into the opening 551. In the embodiment, since the opening 551 of the first insulation layer 550 does not overlap the second pixel G having a relatively small size, such an entry barrier may be formed higher. For example, although the thickness of the first insulation layer 550 is formed to be thicker, the high refractive index material may be properly filled in the opening 551 of the first insulation layer 550, and the second insulation layer 560 may be formed in the opening 551. For example, the thickness of the first insulation layer 550 may be formed up to about 3.5 μm. Since a thickness of the first insulation layer 550 is increased, light collection efficiency to the front may be increased. For example, it is possible to improve the front visibility and light output efficiency of the display device.

Although a method for forming the second insulation layer 560 by applying a material or a high refractive index having fluidity on the first insulation layer 550 has been described above, the method for forming the second insulation layer 560 is not limited thereto. For example, the second insulation layer 560 may be formed of a pressure sensitive adhesive (PSA) having a high refractive index. The pressure sensitive adhesive may include an adhesive material to be adhesive based on an application of a pressure applied to an adhesive surface thereof. The pressure sensitive adhesive may be made by mixing various types of rubber and various resins. The strength of the adhesive may be affected by an amount of pressure applied to the surface of the adhesive. After forming the opening 551 on the first insulation layer 550, a pressure-sensitive adhesive of a high refractive index may be positioned on the first insulation layer 550, and pressure may be applied to form a second insulation layer 560. In case that the pressure may be applied to the pressure-sensitive adhesive of a high refractive index, the second insulation layer 560 may be positioned within the opening 551 of the first insulation layer 550. In case that the second insulation layer 560 is made of a pressure-sensitive adhesive of a high refractive index, the second insulation layer 560 may be positioned within the opening 551 regardless of a size of the opening 551. Therefore, a thickness of the first insulation layer 550 may be increased, and a front visibility and light output efficiency of the display device may be improved.

A polarization layer 600 may be further positioned on the second insulation layer 560. The polarization layer 600 may be positioned in the sensing area TA (e.g., refer to FIG. 2), and may include a line polarizer, a retarder, or the like.

A cover window 620 that protects the sensing area TA and the display area DA may be further positioned on the sensing area TA. An adhesive layer 610 may be further positioned between the polarization layer 600 and the cover window 620.

The display device according to the embodiment may include the first insulation layer 550 including the opening 551 and the second insulation layer 560 positioned within the opening 551 of the first insulation layer 550, thereby improving the front visibility and light output efficiency of the display device. For example, at least a part of the light generated by the first light emitting element EDR and the third light emitting element EDB may be totally reflected at an interface between the first insulation layer 550 and the second insulation layer 560, and thus the light may be condensed to the front.

Light L generated from the emission layers 370R, 370G, and 370B of the pixels R, G, and B may be emitted in various directions and may be incident on the sensing area TA with various incident angles. As shown in FIGS. 5 to 7, a part of the light L emitted from the first light emitting element EDR of the first pixel R and the third light emitting element EDB of the third pixel B and incident to the second insulation layer 560 of the sensing area TA may be emitted to the front, and another part of the light L may be reflected at the interface between the first insulation layer 550 and the second insulation layer 560. For example, in case that an incident angle of the light L incident to the second insulation layer 560 is greater than a threshold angle, the incident light L may be totally reflected at the interface between the first insulation layer 550 and the second insulation layer 560. For example, the total reflection at the interface between the first insulation layer 550 and the second insulation layer 560 may occur while the light L incident on the second insulation layer 560 having a relatively large refractive index proceeds to the first insulation layer 550 having a relatively small refractive index. The interface between the first insulation layer 550 and the second insulation layer 560 may intersect a straight line parallel to the substrate 100 at a predetermined angle. The interface between the first insulation layer 550 and the second insulation layer 560 may be a side surface of the first insulation layer 550. Therefore, the side surface of the first insulation layer 550 may be inclined with a predetermined inclination angle with respect to the upper surface of the second sensing insulation layer 530.

Referring to FIG. 6, the light L emitted from the second light emitting element EDG of the second pixel G and incident on the first insulation layer 550 of the sensing area TA may be emitted to the front after passing through the second insulation layer 560, and other light L may be returned after being reflected by the cover window 620. An opening 551 may be formed in a part of the first insulation layer 550 that overlaps the first pixel R and the third pixel B in a plan view, and the light L is totally reflected at the interface of the first insulation layer 550 and the second insulation layer 560 within the opening 551, and thus the front light output rate may increase.

An opening 551 may not be formed in the portion of the first insulation layer 550 that overlaps the second pixel G in a plan view, and a side light emission rate may be relatively increased compared to the first pixel R and the third pixel B. In case that the opening 551 of the first insulation layer 550 overlaps all pixels R, G, and B in a plan view, a side luminance ratio may be lowered. In the display device according to the embodiment, the side luminance ratio may be improved by not forming the opening 551 in the part of the first insulation layer 550 overlapping some pixels in a plan view.

Hereinafter, referring to FIG. 8 to FIG. 10, the display device according to the embodiment will be compared with display devices according to referential examples.

Figure 8:
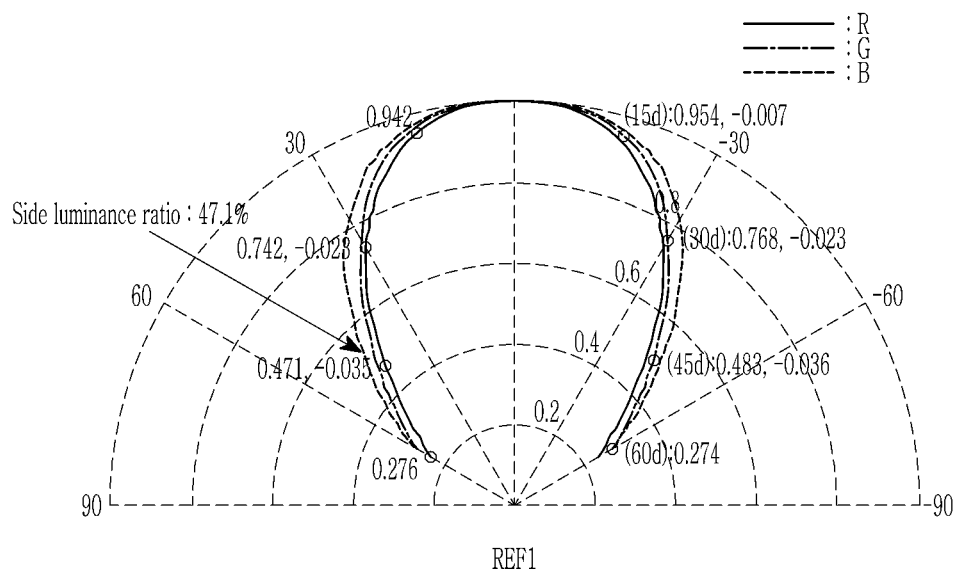
FIG. 8 shows distribution of light in a display device according a first referential example.
Figure 9:
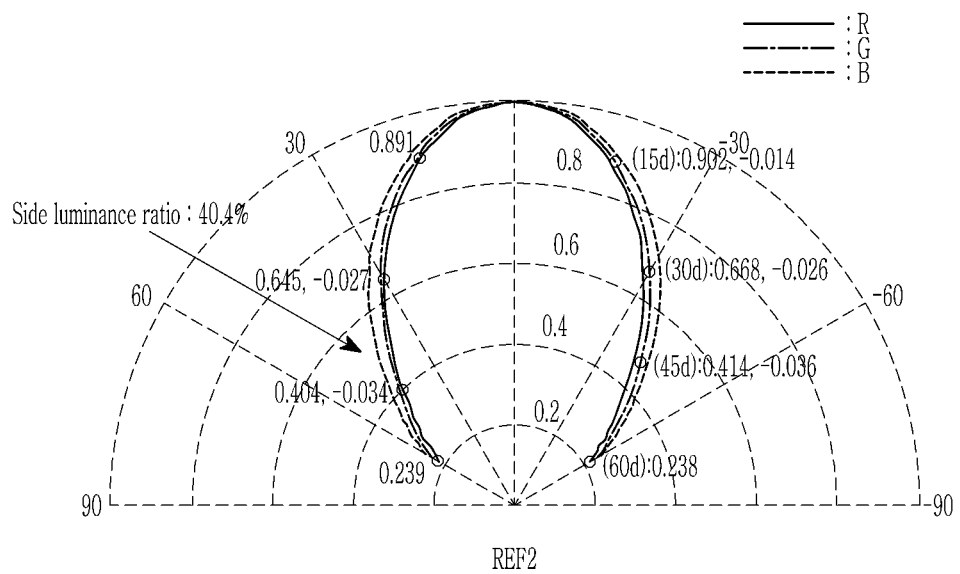
FIG. 9 shows distribution of light in a display device according to a second referential example.

FIG. 8 shows distribution of light in a display device according a first referential example REF1, and FIG. 9 shows distribution of light in a display device according to a second referential example REF2. FIG. 10 shows distribution of light in the display device according to the second referential example REF2 and distribution of light in the display device according to the embodiment. In FIG. 10, the distribution of the light in the display device according to the second referential example REF2 is illustrated in the left, and distribution of light in a display device according to an embodiment. EMB is illustrated in the right.

Figure 10:
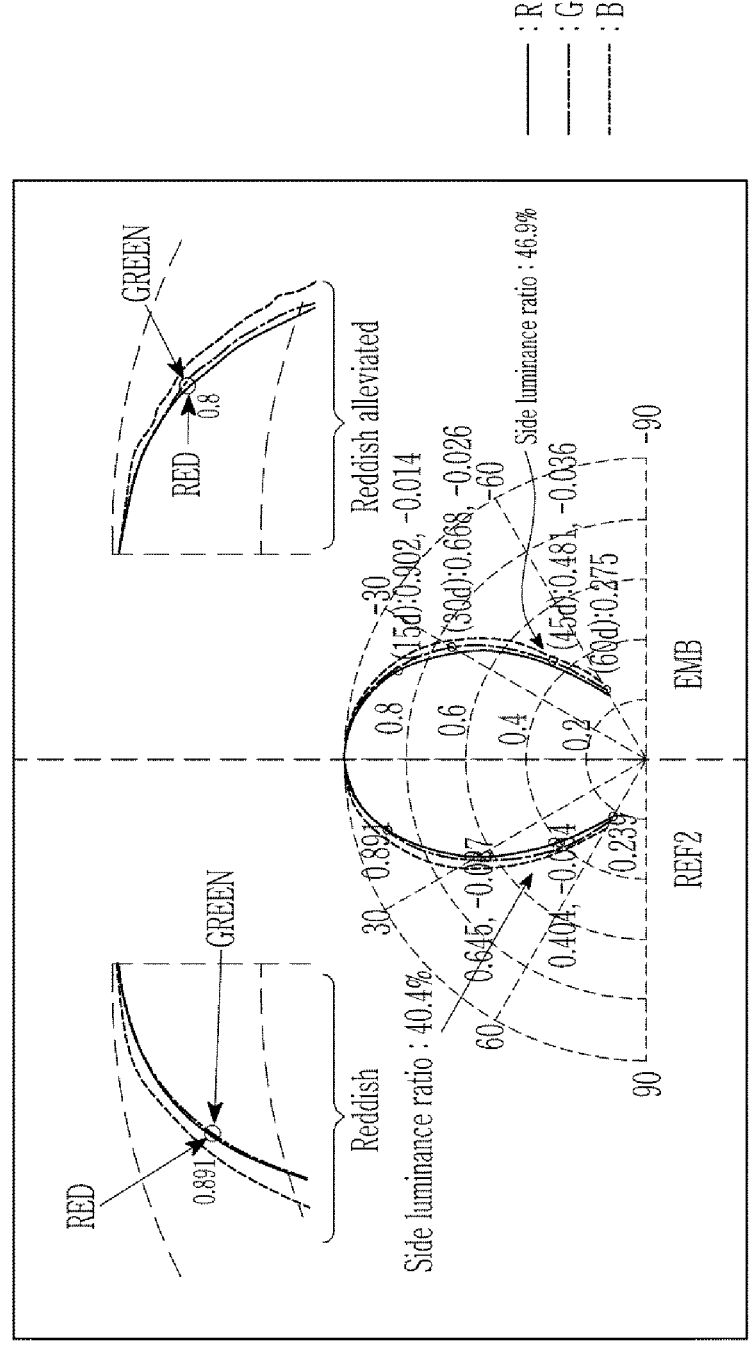
FIG. 10 shows distribution of light in the display device according to the second referential example and distribution of light in the display device according to the embodiment.

In FIGS. 8 to 10, a frontward direction that is perpendicular to the substrate is 0 degree, and light emitted from both sides of the front surface is shown at an angle of about +90 degrees to about -90 degrees, and the amount of light emitted from the corresponding angle is indicated. It is illustrated that most of the light is shown to be distributed in a range between about +30 degrees and about -30 degrees. The remaining light is shown to be distributed between about +30 degrees and about +60 degrees, and between about -30 degrees and about -60 degrees. The light is divided into red light, green light, and blue light.

In the display device according to the first referential example REF1, no opening is formed in a first insulation layer. In the display device according to the second referential example REF2, an opening of a first insulation layer overlaps all pixels in a plan view. In the display device according to the embodiment EMB, an opening of a first insulation layer is formed to overlap some pixels in a plan view, and not overlap some other pixels in a plan view. In this case, the opening of the first insulation layer is formed to overlap the red pixel and blue pixel in a plan view, and does not overlap the green pixel in a plan view.

As shown in FIG. 8, in the display device according to the first referential example REF1, a ratio of the amount of light emitted from a side to the amount of light emitted from a front, that is, a side luminance ratio may be about 47.1%. In this case, the amount of light emitted from the side may represent the amount of light at about 45 degrees. As shown in FIG. 9, in the display device according to the second referential example REF2, the side luminance ratio may be about 40.4%. In the display device according to the second referential example REF2, the opening of the first insulation layer is formed to overlap all the pixels in a plan view, and thus a front luminance ratio may be relatively high, and the side luminance ratio may be relatively low. In the display device according to the first referential example REF1, since the opening is not formed in the first insulation layer, the front light emission ratio may be relatively low, and the side luminance ratio may be relatively high.

As shown in FIG. 10, in the display device according to the embodiment EMB, a side luminance ratio may be about 46.9%. In the display device according to the embodiment EMB, the side luminance ratio may be increased by increasing the amount of light emitted to the side by not forming an opening in the portion of the first insulation layer overlapping the green pixel. In the display device according to the second referential example REF2, at a low angle (range between 0 and about +30 degrees, 0 and about -30 degrees), light emission efficiency of the red pixel is high, and thus a reddish phenomenon may appear. In the display device according to the embodiment EMB, it is possible to prevent the reddish phenomenon from occurring at the low angle side by increasing the side luminance ratio of the green pixel.

For example, the display device according to the embodiment EMB can increase the front light emission ratio by forming an opening in the portion of the first insulation layer overlapping some pixels, and by not forming an opening in the portion of the first insulation layer overlapping some other pixels such that the side luminance ratio can be improved and the radish phenomenon can be alleviated.

Next, referring to FIG. 11, a display device according to an embodiment will be described.

Figure 11:
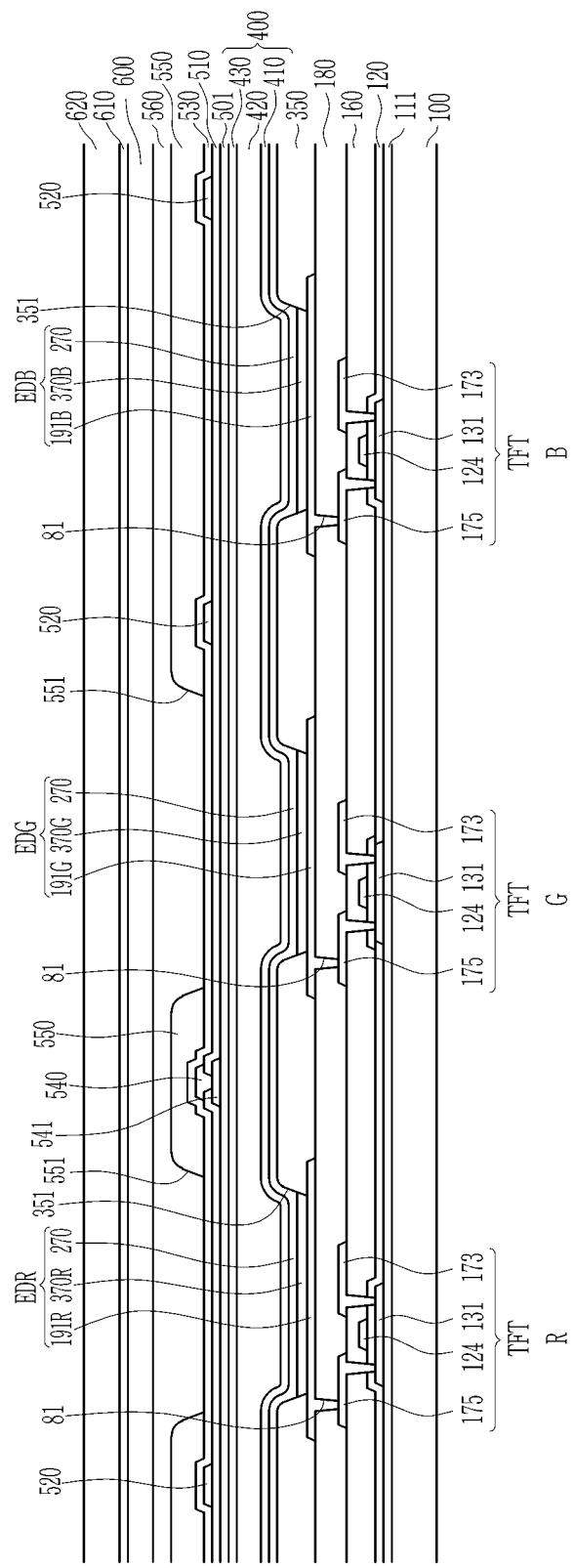
FIG. 11 is a schematic cross-sectional view of a part of a display device according to an embodiment.

A display device according to an embodiment shown in FIG. 11 is almost the same as the display device according to the embodiment of FIG. 1 to FIG. 7, and therefore a description of the same parts will be omitted. This embodiment is different from the previous embodiment at least in that an opening of a first insulation layer does not overlap a third pixel in a plan view, and will be further described below.

FIG. 11 is a schematic cross-sectional view of a part of a display device according to an embodiment.

Referring to FIG. 11, a display device according to an embodiment may include a substrate 100, a transistor TFT disposed on the substrate 100, and light emitting elements EDR, EDG, and EDB electrically connected to the transistor TFT. The display device according to the embodiment may include pixels R, G, and B, and the pixels R, G, and B may include a first pixel R, a second pixel G, and a third pixel B. A first light emitting element EDR may include a first pixel electrode 191R, a first emission layer 370R, and a common electrode 270, and may be positioned in the first pixel R. A second light emitting element EDG may include a second pixel electrode 191G, a second emission layer 370G, and a common electrode 270, and may be positioned in the second pixel G. A third light emitting element EDB may include a third pixel electrode 191B, a third emission layer 370B, and a common electrode 270, and may be positioned in the third pixel B. The first light emitting element EDR may emit red light, the second light emitting element EDG may emit green light, and the third light emitting element EDB may emit blue light. The display device according to the embodiment may further include a first sensing insulation layer 510, a second sensing insulation layer 530, and sensing electrodes 520 and 540 positioned on the light emitting elements EDR, EDG, and EDB. The display device according to the embodiment may further include a first insulation layer 550 including an opening 551, and a second insulation layer 560 positioned on the first insulation layer 550. The first insulation layer 550 and the second insulation layer 560 may be disposed on the sensing electrodes 520 and 540.

The opening 551 of the first insulation layer 550 may overlap the first pixel R and the second pixel G in a plan view, and may not overlap the third pixel B in a plan view. For example, the opening 551 of the first insulation layer 550 may only overlap each of the first pixel R and the second pixel G in a plan view. Accordingly, in the first pixel R and the second pixel G, at least a portion of the second sensing insulation layer 530 may not be covered (or overlapped) by the first insulation layer 550, but may be exposed by the opening 551. The second sensing insulation layer 530 may be exposed by the opening 551 in the first pixel R and the second pixel G, and may be in contact with the second insulation layer 560. In the third pixel B, the entire second sensing insulation layer 530 may be covered by the first insulation layer 550, and the second sensing insulation layer 530 may not be exposed. The opening 551 of the first insulation layer 550 may overlap the first light emitting element EDR and the second light emitting element EDG, and may not overlap the third light emitting element EDB in a plan view. At least a part of the first light emitting element EDR and the second light emitting element EDG may not be covered by the first insulation layer 550, and the third light emitting element EDB may be entirely covered by the first insulation layer 550. The opening 551 of the first insulation layer 550 may overlap the first pixel electrode 191R and the second pixel electrode 191G in a plan view, and may not overlap the third pixel electrode 191B in a plan view. The opening 551 of the first insulation layer 550 may overlap the pixel opening 351 positioned at the first pixel R and the pixel opening 351 positioned at the second pixel G in a plan view, and may not overlap the pixel opening 351 positioned at the third pixel B in a plan view. The opening 551 of the first insulation layer 550 may overlap the first emission layer 370R and the second emission layer 370G, and may not overlap the third emission layer 370B in a plan view.

For example, the display device according to the embodiment can increase the front light emission ratio by forming an opening in the portion of the first insulation layer overlapping some pixels, and by not forming an opening in the portion of the first insulation layer overlapping some other pixels such that the side luminance ratio can be improved, and a color of light emitted from the display device can be adjusted.

Next, referring to FIG. 12, a display device according to an embodiment will be described.

Figure 12:
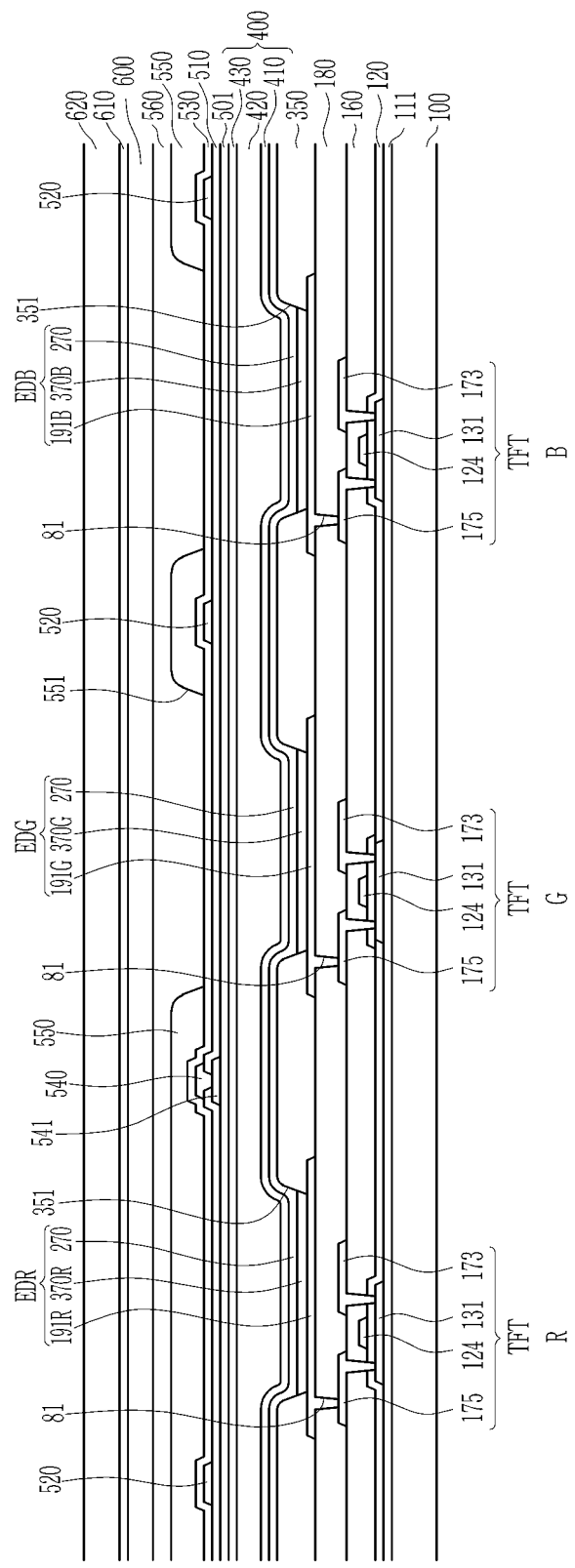
FIG. 12 is a schematic cross-sectional view of a part of a display device according to an embodiment.

A display device according to an embodiment shown in FIG. 12 is almost the same as the display device according to the embodiment shown in FIG. 1 to FIG. 7, and therefore a description of the same parts will be omitted. This embodiment is different from the previous embodiment at least in that an opening of a first insulation layer does not overlap a first pixel in a plan view, which is further described below.

FIG. 12 is a schematic cross-sectional view of a part of a display device according to an embodiment.

Referring to FIG. 12, a display device according to an embodiment may include a substrate 100, a transistor TFT disposed on the substrate 100, and light emitting elements EDR, EDG, and EDB electrically connected to the transistor TFT. The display device according to the embodiment may include pixels R, G, and B, and the pixels R, G, and B may include a first pixel R, a second pixel G, and a third pixel B. A first light emitting element EDR may include a first pixel electrode 191R, a first emission layer 370R, and a common electrode 270, and may be positioned in the first pixel R. A second light emitting element EDG may include a second pixel electrode 191G, a second emission layer 370G, and a common electrode 270, and may be positioned in the second pixel G. A third light emitting element EDB may include a third pixel electrode 191B, a third emission layer 370B, and a common electrode 270, and may be positioned in the third pixel B. The first light emitting element EDR may emit red light, the second light emitting element EDG may emit green light, and the third light emitting element EDB may emit blue light. The display device according to the embodiment may further include a first sensing insulation layer 510, a second sensing insulation layer 530, and sensing electrodes 520 and 540 positioned on the light emitting elements EDR, EDG, and EDB. The display device according to the embodiment may further include a first insulation layer 550 including an opening 551, and a second insulation layer 560 positioned on the first insulation layer 550. The first insulation layer 550 and the second insulation layer 560 may be disposed on the sensing electrodes 520 and 540.

The opening 551 of the first insulation layer 550 may overlap the first pixel R and the second pixel G in a plan view, and may not overlap the third pixel B in a plan view. For example, the opening 551 of the first insulation layer 550 may only overlap each of the first pixel R and the second pixel G in a plan view. Accordingly, in the first pixel R and the second pixel G, at least a portion of the second sensing insulation layer 530 may not be covered by the first insulation layer 550, but may be exposed by the opening 551. The second sensing insulation layer 530 may be exposed by the opening 551 in the second pixel G and the third pixel B, and may be in contact with the second insulation layer 560. In the first pixel R, the entire second sensing insulation layer 530 may be covered by the first insulation layer 550, and the second sensing insulation layer 530 may not be exposed. The opening 551 of the first insulation layer 550 may overlap the second light emitting element EDG and the third light emitting element EDB, and may not overlap the first light emitting element EDR in a plan view. At least a part of the second light emitting element EDG and the third light emitting element EDB may not be covered by the first insulation layer 550, and the first light emitting element EDR may be entirely covered by the first insulation layer 550. The opening 551 of the first insulation layer 550 may overlap the second pixel electrode 191G and the third pixel electrode 191B, and may not overlap the first pixel electrode 191R in a plan view. The opening 551 of the first insulation layer 550 may overlap the pixel opening 351 positioned at the second pixel G and the pixel opening 351 positioned at the third pixel B, and may not overlap the pixel opening 351 positioned at the first pixel R in a plan view. The opening 551 of the first insulation layer 550 may overlap the second emission layer 370G and the third emission layer 370B, and may not overlap the first emission layer 370R in a plan view.

The display device according to the embodiment can increase the front light emission ratio by forming an opening in the portion of the first insulation layer overlapping some pixels, and by not forming an opening in the portion of the first insulation layer overlapping some other pixels such that the side luminance ratio can be improved, and a color of light emitted from the display device can be adjusted.

Next, referring to FIG. 13, a display device according to an embodiment will be described.

Figure 13:
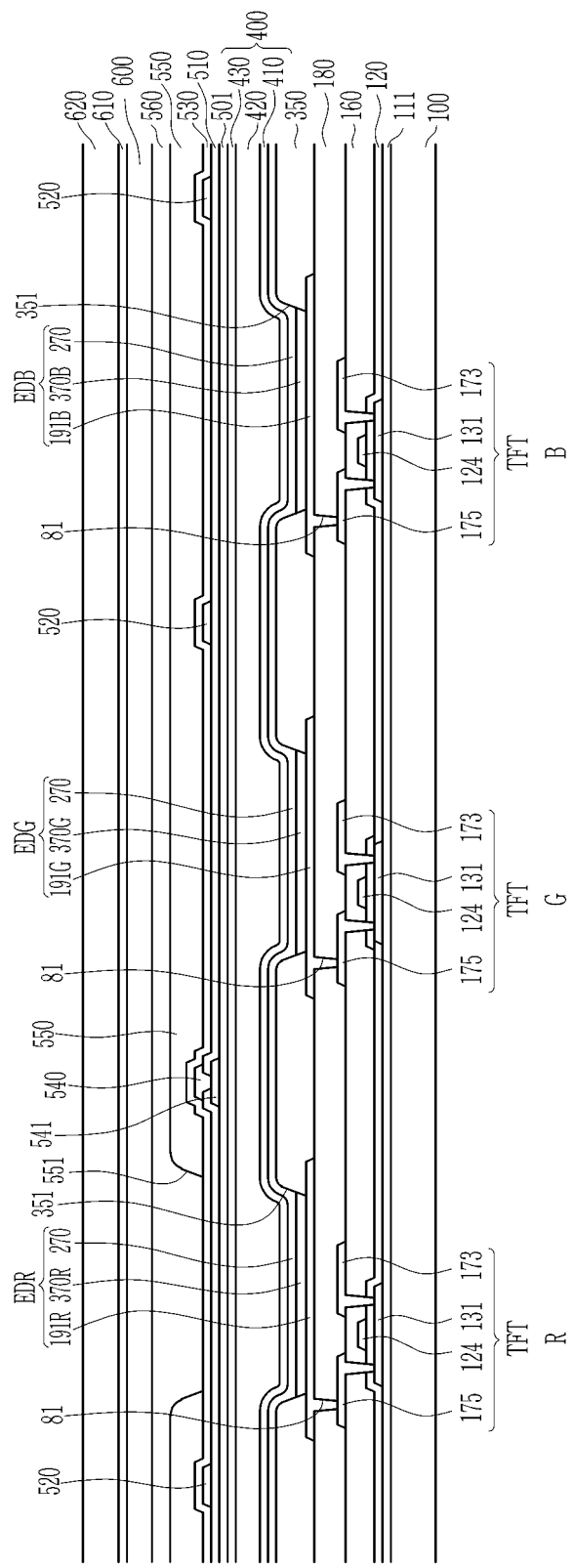
FIG. 13 is a schematic cross-sectional view of a part of a display device according to an embodiment.

A display device according to an embodiment shown in FIG. 13 is almost the same as the display device according to the embodiment shown in FIG. 1 to FIG. 7, and therefore a description of the same parts will be omitted. This embodiment is different from the previous embodiment at least in that an opening of a first insulation layer does not overlap a second pixel and a third pixel in a plan view, which will be further described below.

FIG. 13 is a schematic cross-sectional view of a part of a display device according to an embodiment.

Referring to FIG. 13, a display device according to an embodiment may include a substrate 100, a transistor TFT disposed on the substrate 100, and light emitting elements EDR, EDG, and EDB electrically connected to the transistor TFT. The display device according to the embodiment may include pixels R, G, and B, and the pixels R, G, and B may include a first pixel R, a second pixel G, and a third pixel B. A first light emitting element EDR may include a first pixel electrode 191R, a first emission layer 370R, and a common electrode 270, and may be positioned in the first pixel R. A second light emitting element EDG may include a second pixel electrode 191G, a second emission layer 370G, and a common electrode 270, and may be positioned in the second pixel G. A third light emitting element EDB may include a third pixel electrode 191B, a third emission layer 370B, and a common electrode 270, and may be positioned in the third pixel B. The first light emitting element EDR may emit red light, the second light emitting element EDG may emit green light, and the third light emitting element EDB may emit blue light. The display device according to the embodiment may further include a first sensing insulation layer 510, a second sensing insulation layer 530, and sensing electrodes 520 and 540 positioned on the light emitting elements EDR, EDG, and EDB. The display device according to the embodiment may further include a first insulation layer 550 including an opening 551, and a second insulation layer 560 positioned on the first insulation layer 550. The first insulation layer 550 and the second insulation layer 560 may be disposed on the sensing electrodes 520 and 540.

The opening 551 of the first insulation layer 550 may overlap the first pixel R in a plan view and may not overlap the second pixel G and the third pixel B in a plan view. Accordingly, in the first pixel R, at least a part of the second sensing insulation layer 530 may be exposed without being covered by the first insulation layer 550. For example, a portion of the first insulation layer 550 may be opened in the first pixel R to expose the part of the second sensing insulation layer 530. The second sensing insulation layer 530 exposed by the opening 551 in the first pixel R may be in contact with the second insulation layer 560. In the second pixel G and third pixel B, the entire second sensing insulation layer 530 may be covered by the first insulation layer 550, and the second sensing insulation layer 530 may not be exposed. The opening 551 of the first insulation layer 550 may overlap the first light emitting element EDR, and may not overlap the second light emitting element EDG and the third light emitting element EDB in a plan view. At least a part of the first light emitting element EDR may not be covered by the first insulation layer 550, and the second light emitting element EDG and the third light emitting element EDB may be entirely covered by the first insulation layer 550. The opening 551 of the first insulation layer 550 may overlap the first pixel electrode 191R, and may not overlap the second pixel electrode 191G and the third pixel electrode 191B in a plan view. The opening 551 of the first insulation layer 550 may overlap the pixel opening 351 positioned at the first pixel R in a plan view, and may not overlap the pixel opening 351 positioned at the second pixel G or the pixel opening 351 positioned at the third pixel B in a plan view. The opening 551 of the first insulation layer 550 may overlap the first emission layer 370R in a plan view, and may not overlap the second emission layer 370G and the third emission layer 370B in a plan view.

The display device according to the embodiment can increase the front light emission ratio by forming an opening in the portion of the first insulation layer overlapping some pixels, and by not forming an opening in the portion of the first insulation layer overlapping some other pixels such that the side luminance ratio can be improved, and a color of light emitted from the display device can be adjusted.

Next, a display device according to an embodiment will be described with reference to FIG. 14.

Figure 14:
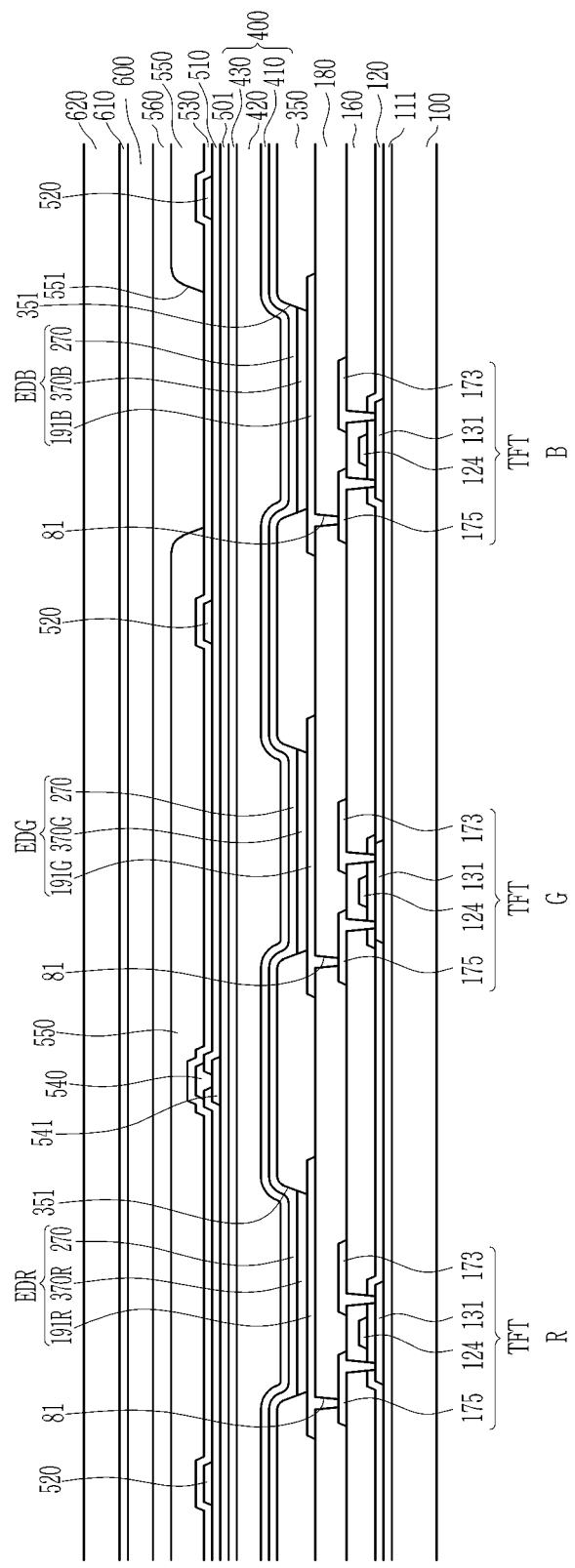
FIG. 14 is a schematic cross-sectional view of a part of a display device according to an embodiment.

A display device according to an embodiment illustrated in FIG. 14 is almost the same as the display device according to the embodiment shown in FIG. 1 to FIG. 7, and therefore the description of the same portions will be omitted. This embodiment is different from the previous embodiment at least in that an opening of a first insulation layer does not overlap a first pixel and a second pixel in a plan view, and will be described further below.

FIG. 14 is a schematic cross-sectional view of a part of a display device according to an embodiment.

As shown in FIG. 14, a display device according to an embodiment may include a substrate 100, a transistor TFT disposed on the substrate 100, and light emitting elements EDR, EDG, and EDB electrically connected to the transistor TFT. The display device according to the embodiment may include pixels R, G, and B, and the pixels R, G, and B may include a first pixel R, a second pixel G, and a third pixel B. A first light emitting element EDR may include a first pixel electrode 191R, a first emission layer 370R, and a common electrode 270, and may be positioned in the first pixel R. A second light emitting element EDG may include a second pixel electrode 191G, a second emission layer 370G, and a common electrode 270, and may be positioned in the second pixel G. A third light emitting element EDB may include a third pixel electrode 191B, a third emission layer 370B, and a common electrode 270, and may be positioned in the third pixel B. The first light emitting element EDR may emit red light, the second light emitting element EDG may emit green light, and the third light emitting element EDB may emit blue light. The display device according to the embodiment may further include a first sensing insulation layer 510, a second sensing insulation layer 530, and sensing electrodes 520 and 540 positioned on the light emitting elements EDR, EDG, and EDB. The display device according to the embodiment may further include a first insulation layer 550 including an opening 551, and a second insulation layer 560 positioned on the first insulation layer 550. The first insulation layer 550 and the second insulation layer 560 may be disposed on the sensing electrodes 520 and 540.

The opening 551 of the first insulation layer 550 may overlap the third pixel B in a plan view and may not overlap the first pixel R and the second pixel G in a plan view. Accordingly, in the third pixel B, at least a part of the second sensing insulation layer 530 may be exposed without being covered by the first insulation layer 550. For example, a portion of the first insulation layer 550 may be opened in the third pixel B to expose the part of the second sensing insulation layer 530. The second sensing insulation layer 530 exposed by the opening 551 in the third pixel B may be in contact with the second insulation layer 560. In the first pixel R and second pixel G, the entire second sensing insulation layer 530 may be covered by the first insulation layer 550, and the second sensing insulation layer 530 may not be exposed. The opening 551 of the first insulation layer 550 may overlap the third light emitting element EDB in a plan view, and may not overlap the first light emitting element EDR and the second light emitting element EDG in a plan view. At least a part of the third light emitting element EDB may not be covered by the first insulation layer 550, and the first light emitting element EDR and the second light emitting element EDG may be entirely covered by the first insulation layer 550. The opening 551 of the first insulation layer 550 may overlap the third pixel electrode 191B and may not overlap the first pixel electrode 191R and the second pixel electrode 191G in a plan view. The opening 551 of the first insulation layer 550 may overlap the pixel opening 351 positioned at the third pixel B, and may not overlap the pixel opening 351 positioned at the first pixel R and the pixel opening 351 positioned at the second pixel G in a plan view. The opening 551 of the first insulation layer 550 may overlap the third emission layer 370B, and may not overlap the first emission layer 370R or the second emission layer 370G in a plan view.

The display device according to the embodiment can increase the front light emission ratio by forming an opening in the portion of the first insulation layer overlapping some pixels, and by not forming an opening in the portion of the first insulation layer overlapping some other pixels such that the side luminance ratio can be improved, and a color of light emitted from the display device can be adjusted.

Next, a display device according to an embodiment will be described with reference to FIG. 15.

Figure 15:
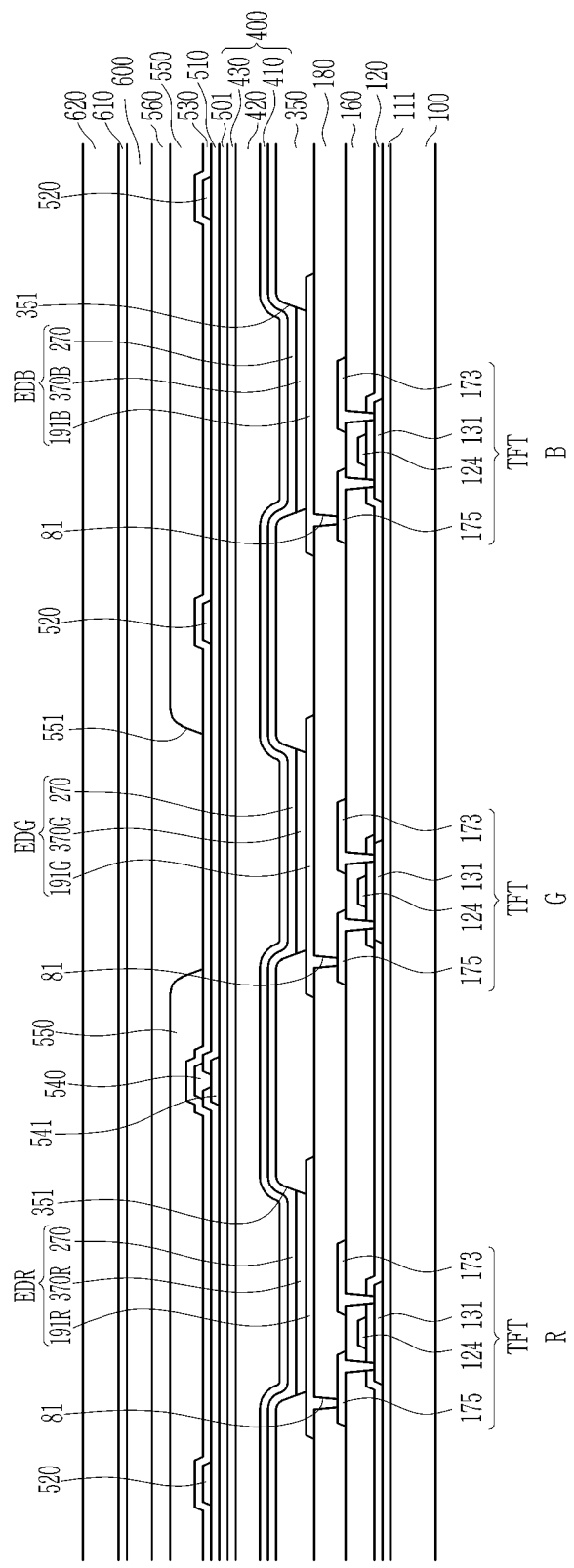
FIG. 15 is a schematic cross-sectional view of a part of a display device according to an embodiment.

A display device according to an embodiment illustrated in FIG. 15 is almost the same as the display device according to the embodiment shown in FIG. 1 to FIG. 7, and therefore the description of the same portions will be omitted. This embodiment is different from the previous embodiment at least in that an opening of a first insulation layer does not overlap a first pixel and a third pixel, and will be described further below.

FIG. 15 is a schematic cross-sectional view of a part of a display device according to an embodiment.

As shown in FIG. 15, a display device according to an embodiment may include a substrate 100, a transistor TFT disposed on the substrate 100, and light emitting elements EDR, EDG, and EDB electrically connected to the transistor TFT. The display device according to the embodiment may include pixels R, G, and B, and the pixels R, G, and B may include a first pixel R, a second pixel G, and a third pixel B. A first light emitting element EDR may include a first pixel electrode 191R, a first emission layer 370R, and a common electrode 270, and may be positioned in the first pixel R. A second light emitting element EDG may include a second pixel electrode 191G, a second emission layer 370G, and a common electrode 270, and may be positioned in the second pixel. A third light emitting element EDB may include a third pixel electrode 191B, a third emission layer 370B, and a common electrode 270, and may be positioned in the third pixel B. The first light emitting element EDR may emit red light, the second light emitting element EDG may emit green light, and the third light emitting element EDB may emit blue light. The display device according to the embodiment may further include a first sensing insulation layer 510, a second sensing insulation layer 530, and sensing electrodes 520 and 540 positioned on the light emitting elements EDR, EDG, and EDB. The display device according to the embodiment may further include a first insulation layer 550 including an opening 551, and a second insulation layer 560 positioned on the first insulation layer 550. The first insulation layer 550 and the second insulation layer 560 may be disposed on the sensing electrodes 520 and 540.

The opening 551 of the first insulation layer 550 may overlap the second pixel G in a plan view and may not overlap the first pixel R and the third pixel B in a plan view. Accordingly, in the second pixel G, at least a part of the second sensing insulation layer 530 may be exposed without being covered by the first insulation layer 550. For example, a portion of the first insulation layer 550 may be opened in the second pixel G to expose the part of the second sensing insulation layer 530. The second sensing insulation layer 530 exposed by the opening 551 in the second pixel G may be in contact with the second insulation layer 560. In the first pixel R and the third pixel B, the entire second sensing insulation layer 530 may be covered by the first insulation layer 550, and the second sensing insulation layer 530 may not be exposed. The opening 551 of the first insulation layer 550 may overlap the second light emitting element EDG in a plan view, and may not overlap the first light emitting element EDR and the third light emitting element EDB in a plan view. At least a part of the second light emitting element EDG may not be covered by the first insulation layer 550, and the first light emitting element EDR and the third light emitting element EDB may be entirely covered by the first insulation layer 550. The opening 551 of the first insulation layer 550 may overlap the second pixel electrode 191G and may not overlap the first pixel electrode 191R and the third pixel electrode 191B in a plan view. The opening 551 of the first insulation layer 550 may overlap the pixel opening 351 positioned at the second pixel G in a plan view, and may not overlap the pixel opening 351 positioned at the first pixel R and the pixel opening 351 positioned at the third pixel B in a plan view. The opening 551 of the first insulation layer 550 may overlap the second emission layer 370G in a plan view, and may not overlap the first emission layer 370R and the third emission layer 370B in a plan view.

The display device according to the embodiment can increase the front light emission ratio by forming an opening in the portion of the first insulation layer overlapping some pixels, and by not forming an opening in the portion of the first insulation layer overlapping some other pixels such that the side luminance ratio can be improved, and a color of light emitted from the display device can be adjusted.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:
1. A display device comprising:
   a first light emitting element, a second light emitting element, and a third light emitting element that are disposed on a substrate and emitting light of different colors, respectively;
   a first insulation layer disposed on the first light emitting element, the second light emitting element, and the third light emitting element, the first insulation layer including at least one opening; and
   a second insulation layer disposed on the first insulation layer, the second insulation layer being disposed in the at least one opening, wherein
   a refractive index of the second insulation layer is higher than a refractive index of the first insulation layer,
   the at least one opening overlaps at least one of the first light emitting element, the second light emitting element, and the third light emitting element in a plan view, and the at least one opening does not overlap at least another one of the first light emitting element, the second light emitting element, and the third light emitting element in a plan view.

2. The display device of claim 1, wherein
the at least one opening overlaps the first light emitting element and the third light emitting element in a plan view, and
the at least one opening does not overlap the second light emitting element in a plan view.

3. The display device of claim 2, wherein the first insulation layer covers the entire second light emitting element.

4. The display device of claim 3, wherein
the first light emitting element emits red light,
the second light emitting element emits green light, and
the third light emitting element emits blue light.

5. The display device of claim 1, wherein
the at least one opening overlaps the first light emitting element in a plan view, and
the at least one opening does not overlap the second light emitting element and the third light emitting element in a plan view.

6. The display device of claim 1, further comprising:
a first pixel electrode, a second pixel electrode, and a third pixel electrode disposed on the substrate; and
a bank layer disposed on the first pixel electrode, the second pixel electrode, and the third pixel electrode, wherein
the bank layer includes a plurality of pixel openings overlapping the first pixel electrode, the second pixel electrode, and the third pixel electrode in a plan view,
the at least one opening overlaps at least one of the plurality of pixel openings in a plan view, and
the at least one opening does not overlap at least another one of the plurality of pixel openings in a plan view.

7. The display device of claim 6, further comprising:
a first emission layer disposed on the first pixel electrode;
a second emission layer disposed on the second pixel electrode;
a third emission layer disposed on the third pixel electrode; and
a common electrode disposed on the first emission layer, the second emission layer, the third emission layer, and the bank layer, wherein
the at least one opening overlaps at least one of the first emission layer, the second emission layer, and the third emission layer in a plan view, and
the at least one opening does not overlap at least another one of the first emission layer, the second emission layer, and the third emission layer in a plan view.

8. The display device of claim 7, wherein
the first pixel electrode, the first emission layer, and the common electrode form the first light emitting element,
the second pixel electrode, the second emission layer, and the common electrode form the second light emitting element, and
the third pixel electrode, the third emission layer, and the common electrode form the third light emitting element.

9. The display device of claim 8, wherein
the at least one opening overlaps the first pixel electrode and the first emission layer in a plan view and overlaps the third pixel electrode and the third emission layer in a plan view, and
the at least one opening does not overlap the second pixel electrode and the second emission layer in a plan view.

10. The display device of claim 8, wherein
the at least one opening overlaps the first pixel electrode and the first emission layer in a plan view,
the at least one opening does not overlap the second pixel electrode, the second emission layer in a plan view, and does not overlap the third pixel electrode and the third emission layer in a plan view.

11. The display device of claim 6, wherein the plurality of pixel openings are positioned within the at least one opening in a plan view.

12. The display device of claim 1, wherein
a refractive index of the first insulation layer is in a range of about 1.40 to about 1.59, and
a refractive index of the second insulation layer is in a range of about 1.60 to about 1.80.

13. The display device of claim 1, wherein a thickness of the first insulation layer is in a range of about 2.0 μm to about 3.5 μm.

14. The display device of claim 1, wherein the second insulation layer is formed of a light-transmitting organic insulating material or a pressure-sensitive adhesive.

15. The display device of claim 1, further comprising:
an encapsulation layer disposed on the first light emitting element, the second light emitting element, and the third light emitting element; and
a sensing electrode disposed on the encapsulation layer, wherein the first insulation layer is disposed on the sensing electrode.

* * * * *